United States Patent
Xu et al.

(10) Patent No.: US 12,193,290 B2
(45) Date of Patent: Jan. 7, 2025

(54) DISPLAY SUBSTRATE, PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yuanjie Xu, Beijing (CN); Benlian Wang, Beijing (CN); Lili Du, Beijing (CN); Zhenhua Zhang, Beijing (CN); Yuxin Zhang, Beijing (CN); Pan Xu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 383 days.

(21) Appl. No.: 17/629,772

(22) PCT Filed: Apr. 30, 2021

(86) PCT No.: PCT/CN2021/091485
§ 371 (c)(1),
(2) Date: Jan. 24, 2022

(87) PCT Pub. No.: WO2022/160492
PCT Pub. Date: Aug. 4, 2022

(65) Prior Publication Data
US 2023/0165091 A1    May 25, 2023

(30) Foreign Application Priority Data
Jan. 29, 2021 (WO) .............. PCT/CN2021/074469

(51) Int. Cl.
*H01L 21/56* (2006.01)
*G09G 3/3233* (2016.01)
(Continued)

(52) U.S. Cl.
CPC ......... *H10K 59/131* (2023.02); *G09G 3/3233* (2013.01); *H10K 59/1201* (2023.02);
(Continued)

(58) Field of Classification Search
CPC ............. H10K 59/131; H10K 59/1201; H10K 59/1213; H10K 59/1216; H10K 59/1315;
(Continued)

(56) References Cited

U.S. PATENT DOCUMENTS 9,835,917 B2 * 12/2017 Zhao .................. G01R 31/2825
10,879,319 B2 * 12/2020 Bang ...................... H10K 50/80
(Continued)

FOREIGN PATENT DOCUMENTS

| CN | 106057820 A | 10/2016 |
|----|-------------|---------|
| CN | 106707646 A | 5/2017  |

(Continued)

OTHER PUBLICATIONS

European Search Report for 21922089.4 Mailed Sep. 19, 2023.
European Search Report for 21922090.2 Mailed Sep. 21, 2023.
Office Action dated Jul. 8, 2024 for U.S. Appl. No. 17/640,230.

*Primary Examiner* — Vu A Vu
(74) *Attorney, Agent, or Firm* — Ling Wu; Stephen Yang; Ling and Yang Intellectual Property

(57) ABSTRACT

Provided are a display substrate, a preparation method thereof, and a display device. The display substrate includes a display region and a bonding region on one side of the display region. The bonding region at least includes a lead area; the display region includes a plurality of data lines and a plurality of data fanout lines, the lead area includes a plurality of lead wires, and orthographic projections of the plurality of data lines and the plurality of data fanout lines on a plane of the display substrate are at least partially overlapped. At least one lead wire is connected to the data
(Continued)

line through the data fanout line. In the lead area, an orthographic projection of any one of the lead wires on the plane of the display substrate and orthographic projections of other lead wires on the plane of the display substrate have no overlap region.

11 Claims, 14 Drawing Sheets

(51) Int. Cl.
- *H10K 59/12* (2023.01)
- *H10K 59/121* (2023.01)
- *H10K 59/131* (2023.01)
- H10K 59/35 (2023.01)

(52) U.S. Cl.
CPC ..... *H10K 59/1213* (2023.02); *H10K 59/1216* (2023.02); *H10K 59/1315* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *H10K 59/35* (2023.02)

(58) Field of Classification Search
CPC ............... H10K 59/35; G09G 3/3233; G09G 2300/0426; G09G 2300/0819; G09G 2300/0842; G09G 2300/0861; G09G 2310/08; G09G 2310/0251; G09G 2310/061; G09G 2320/0204; G09G 3/3241; G09G 3/32; G02F 1/1362
USPC .......................................................... 257/91
See application file for complete search history.

(56) References Cited

U.S. PATENT DOCUMENTS

| | | | | |
|---|---|---|---|---|
| 10,978,447 | B2* | 4/2021 | Kim | H10K 50/824 |
| 11,183,543 | B2* | 11/2021 | Bang | H10K 59/131 |
| 11,625,069 | B2* | 4/2023 | Bang | G06F 1/189 |
| | | | | 361/679.02 |
| 11,678,537 | B2* | 6/2023 | Choi | G06F 3/0446 |
| | | | | 257/88 |
| 11,871,624 | B2* | 1/2024 | Son | H10K 59/124 |
| 11,943,956 | B2* | 3/2024 | Woo | H10K 50/86 |
| 2013/0033834 | A1 | 2/2013 | Kwon et al. | |
| 2015/0001482 | A1 | 1/2015 | Jung | |
| 2016/0225304 | A1 | 8/2016 | Kim | |
| 2018/0173346 | A1 | 6/2018 | Du et al. | |
| 2018/0197484 | A1 | 7/2018 | Moon et al. | |
| 2019/0326336 | A1 | 10/2019 | Xi et al. | |
| 2020/0013833 | A1 | 1/2020 | Wang et al. | |
| 2020/0090559 | A1* | 3/2020 | Song | H10K 59/121 |
| 2020/0110497 | A1 | 4/2020 | Jin et al. | |
| 2020/0174525 | A1 | 6/2020 | Feng | |
| 2020/0227503 | A1 | 7/2020 | Yi et al. | |
| 2020/0312252 | A1 | 10/2020 | Jeong et al. | |
| 2020/0342791 | A1 | 10/2020 | Song et al. | |
| 2020/0343331 | A1 | 10/2020 | Jeong et al. | |
| 2020/0388230 | A1 | 12/2020 | Lee | |
| 2021/0005631 | A1 | 1/2021 | Wang et al. | |
| 2021/0013287 | A1 | 1/2021 | Bang et al. | |
| 2021/0020724 | A1 | 1/2021 | Cho et al. | |
| 2021/0027717 | A1 | 1/2021 | Kim | |
| 2021/0083036 | A1 | 3/2021 | Kang et al. | |
| 2021/0090490 | A1 | 3/2021 | Lee et al. | |
| 2021/0118976 | A1 | 4/2021 | Zhao et al. | |
| 2021/0233899 | A1 | 7/2021 | Lu | |
| 2021/0257435 | A1* | 8/2021 | Kim | H10K 59/353 |
| 2021/0273035 | A1 | 9/2021 | Cho et al. | |
| 2021/0399262 | A1* | 12/2021 | Woo | H10K 59/40 |
| 2021/0408214 | A1* | 12/2021 | Wang | H10K 59/131 |

FOREIGN PATENT DOCUMENTS

| | | |
|---|---|---|
| CN | 106782270 A | 5/2017 |
| CN | 107170783 A | 9/2017 |
| CN | 107656646 A | 2/2018 |
| CN | 107919090 A | 4/2018 |
| CN | 108153438 A | 6/2018 |
| CN | 108319397 A | 7/2018 |
| CN | 208444523 U | 1/2019 |
| CN | 109448555 A | 3/2019 |
| CN | 109449196 A | 3/2019 |
| CN | 109541865 A | 3/2019 |
| CN | 110085643 A | 8/2019 |
| CN | 110148606 A | 8/2019 |
| CN | 110286534 A | 9/2019 |
| CN | 110531559 A | 12/2019 |
| CN | 110910774 A | 3/2020 |
| CN | 110911444 A | 3/2020 |
| CN | 111384066 A | 7/2020 |
| CN | 111430408 A | 7/2020 |
| CN | 111522463 A | 8/2020 |
| CN | 111653603 A | 9/2020 |
| CN | 111665995 A | 9/2020 |
| CN | 111722762 A | 9/2020 |
| CN | 111755476 A | 10/2020 |
| CN | 111886925 A | 11/2020 |
| CN | 112054038 A | 12/2020 |
| CN | 112180644 A | 1/2021 |
| CN | 112185267 A | 1/2021 |
| CN | 112186022 A | 1/2021 |
| CN | 112201680 A | 1/2021 |
| CN | 112216721 A | 1/2021 |
| CN | 112242425 A | 1/2021 |
| CN | 112255852 A | 1/2021 |
| CN | 112310125 A | 2/2021 |
| CN | 112310150 A | 2/2021 |
| CN | 112510066 A | 3/2021 |
| EP | 3748682 A1 | 12/2020 |
| JP | 2000-28642 A | 1/2000 |
| TW | 201518748 A | 5/2015 |
| WO | 2015081672 A1 | 6/2015 |
| WO | 2020017835 A1 | 1/2020 |

* cited by examiner

DISPLAY SUBSTRATE, PREPARATION METHOD THEREOF, AND DISPLAY DEVICE

CROSS-REFERENCE TO RELATED APPLICATIONS

The present application is a U.S. National Phase Entry of International Application No. PCT/CN2021/091485 having an international filing date of Apr. 30, 2021 and claims priority to PCT Application No. PCT/CN2021/074469, filed on Jan. 29, 2021 and entitled "Display Substrate and Display Device". The above-identified applications are the disclosure of which should be interpreted as being hereby incorporated by reference in their entireties.

TECHNICAL FIELD

The present disclosure relates to, but is not limited to, the field of display technologies, and particularly to a display substrate, a preparation method thereof, and a display device.

BACKGROUND

An Organic Light Emitting Diode (OLED) is an active light emitting display device having the advantages such as self-illumination, wide viewing angle, high contrast, low power consumption, and extremely high response speed. With the constant development of a display technology, a display device using an OLED as an emitting device and a Thin Film Transistor (TFT) for signal control has become a mainstream product in the field of display at present.

SUMMARY

The below is a summary about the subject matter described in the present disclosure in detail. The summary is not intended to limit the scope of protection of the claims.

According to an aspect, an exemplary embodiment of the present disclosure provides a display substrate, including a display region and a bonding region on a side of the display region; the bonding region at least includes a lead area; the display region includes a plurality of data lines and a plurality of data fanout lines, the lead area includes a plurality of lead wires, and orthographic projections of the plurality of data lines and the plurality of data fanout lines on a plane of the display substrate are at least partially overlapped; at least one lead wire is connected to a data line through a data fanout line; and in the lead area, an orthographic projection of any one of the lead wires on the plane of the display substrate and orthographic projections of other lead wires on the plane of the display substrate have no overlap region.

In an exemplary implementation, at least one lead wire is directly connected to the data line.

In an exemplary implementation, the quantity of the data lines is greater than the quantity of the data fanout lines.

In an exemplary implementation, at least one data fanout line includes a first line segment, a second line segment, and a third line segment; a first end of the first line segment is connected to the lead wire, a second end of the first line segment extends in a direction away from the lead area, to be connected to a first end of the second line segment; a second end of the second line segment extends along a second direction or an opposite direction of the second direction, to be connected to a first end of the third line segment; a second end of the third line segment extends in a direction approaching the lead area, to be connected to the data line through a via; the second direction intersects the first direction, and the first direction is parallel to the data line.

In an exemplary implementation, the third line segment includes an extending segment and a connecting segment; a first end of the extending segment is located in the display region, and is connected to the second end of the second line segment, and a second end of the extending segment extends to an edge of the display region in a direction approaching the lead area, to be connected to a first end of the connecting segment; and a second end of the connecting segment extends in a direction away from the display region, to be connected to the data line through a via, the data line extending to the lead area; and the edge of the display region is an edge on a side, close to the lead area, of the display region.

In an exemplary implementation, a plurality of vias through which the data fanout lines are connected to the data lines have the same distance from the edge of the display region.

In an exemplary implementation, the first line segment is parallel to the first direction, and the extending segment of the third line segment is parallel to the first direction.

In an exemplary implementation, a spacing between adjacent first line segments is the same as a spacing between adjacent data lines, and a spacing between extending segments of adjacent third line segments is the same as the spacing between the adjacent data lines.

In an exemplary implementation, a first included angle is formed between the first line segment and the first direction, and/or, a second included angle is formed between the extending segment of the third line segment and the first direction, the first included angle ranging from 20° to 70°, and the second included angle ranging from 20° to 70°.

In an exemplary implementation, the first line segment includes a first straight line segment and a first oblique line segment; a first end of the first straight line segment is connected to the lead wire, a second end of the first straight line segment extends in a direction away from the lead area, to be connected to a first end of the first oblique line segment; the first oblique line segment extends in a direction away from the lead area, to be connected to a first end of the second line segment; a first included angle is formed between the first oblique line segment and the first direction, the first included angle ranges from 20° to 70°, and the second end of the first straight line segment has a first distance from the edge of the display region; and/or, the extending segment of the third line segment includes a third oblique line segment and a third straight line segment; a first end of the third oblique line segment is connected to a second end of the second line segment, a second end of the third oblique line segment extends in a direction approaching the lead area, to be connected to a first end of the third straight line segment, a second end of the third straight line segment extends to the edge of the display region in a direction approaching the lead area, to be connected to the first end of the connecting segment; a second included angle is formed between the third oblique line segment and the first direction, the second included angle ranges from 20° to 70°, and the first end of the third straight line segment has a second distance from the edge of the display region.

In an exemplary implementation, the second line segment includes a plurality of sub-segments, the plurality of sub-segments are interwoven to form a plurality of grid patterns, and the plurality of grid patterns are repeated and consecutively arranged in the first direction and/or the second direction.

In an exemplary implementation, at least one data fanout line includes a first line segment and a second line segment; a first end of the first line segment is connected to the lead wire, and a second end of the first line segment extends in a direction away from the lead area, to be connected to a first end of the second line segment; a second end of the second line segment extends along a second direction or an opposite direction of the second direction, to be connected to the data line through a via; the second direction intersects the first direction, and the first direction is parallel to the data line.

In an exemplary implementation, a plurality of vias through which the data fanout lines are connected to the data lines have different distances from the edge of the display region; and the edge of the display region is an edge, on a side, close to the lead area, of the display region.

In an exemplary implementation, at least one data fanout line includes a first line segment and a second line segment; a first end of the first line segment is connected to the lead wire, and a second end of the first line segment extends in a direction away from the lead area, to be connected to the second line segment; the second line segment includes a plurality of sub-segments, the plurality of sub-segments are interwoven to form a plurality of grid patterns, the plurality of grid patterns are repeated and consecutively arranged in the first direction and/or the second direction, and at least one sub-segment is connected to the data line through a via; the second direction intersects the first direction, and the first direction is parallel to the data line.

In an exemplary implementation, the plurality of lead wires in the lead area have the same width, adjacent lead wires have the same spacing, the width and the spacing are dimensions in the second direction, the second direction intersects the first direction, and the first direction is parallel to the data line.

In an exemplary implementation, in a plane parallel to the display substrate, the display substrate has a center line, the center line extends in a first direction and equally divides pixel columns of the display region, the first direction being parallel to the data line; on one side of the center line, the plurality of data lines include a first data line group and a second data line group, and the plurality of lead wires include a first lead group and a second lead group; the first data line group includes a first data line, a second data line, . . . , and an Mth data line that are arranged in sequence along a second direction, the second data line group is arranged on one side of the first data line group in the second direction, the second data line group includes an (M+1)th data line, an (M+2)th data line, . . . , and an Nth data line that are arranged in sequence along the second direction, the second direction being intersected with the first direction; the first lead group includes a first lead wire, a second lead wire, . . . , and an Mth lead wire that are arranged in sequence along an opposite direction of the second direction, the second lead group includes an (M+1)th lead wire, an (M+2)th lead wire, . . . , and an Nth lead wire that are arranged in sequence along the second direction, the lead wires of the first lead group and the lead wires of the second lead group being alternately arranged; M, and N are positive integers greater than 2, and M is less than N; the lead wires in the first lead group are connected to the data lines in the first data line group through the data fanout lines, and the lead wires in the second lead group are directly connected to the data lines in the second data line group.

In an exemplary implementation, in a plane perpendicular to the display panel, the display substrate includes a first conductive layer, a second conductive layer, and a third conductive layer, and an insulating layer is arranged between the first conductive layer and the second conductive layer as well as between the second conductive layer and the third conductive layer; and the data lines and the data fanout lines are arranged in different conductive layers.

In an exemplary implementation, the data fanout lines include odd data fanout lines and even data fanout lines, the odd data fanout lines are connected to the data lines in odd columns in the first data line group, and the even data fanout lines are connected to the data lines in even columns in the first data line group; and the odd data fanout lines and the even data fanout lines are arranged in different conductive layers.

In an exemplary implementation, the lead wires include odd lead wires and even lead wires, the odd lead wires are connected to the data lines in odd columns in the first data line group through the odd data fanout lines, or are directly connected to the data lines in odd columns in the second data line group; and the even lead wires are connected to the data lines in even columns in the first data line group through the even data fanout lines, or are directly connected to the data lines in even columns in the second data line group; the odd lead wires and the odd data fanout lines are arranged in the same layer and are of an integrated structure connected to each other, and the even lead wires and the even data fanout lines are arranged in the same layer and are of an integrated structure connected to each other.

In an exemplary implementation, the odd data fanout lines are arranged in the first conductive layer, the even data fanout lines are arranged in the second conductive layer, and the data lines are arranged in the third conductive layer; or, the even data fanout lines are arranged in the first conductive layer, the odd data fanout lines are arranged in the second conductive layer, and the data lines are arranged in the third conductive layer.

In an exemplary implementation, the first conductive layer and the second conductive layer are made of the same material.

According to another aspect, an exemplary embodiment of the present disclosure also provides a display device, which includes the display substrate described in any one of the foregoing.

According to still another aspect, an exemplary embodiment of the present disclosure also provides a preparation method for a display substrate; the display substrate includes a display region and a bonding region on one side of the display region, the bonding region at least including a lead area; the preparation method includes the following operations.

A plurality of data lines and a plurality of data fanout lines are formed in the display region, and a plurality of lead wires are formed in the lead area, herein orthographic projections of the plurality of data lines and the plurality of data fanout lines on a plane of the display substrate are at least partially overlapped; at least one lead wire is connected to the data line through the data fanout line, and in the lead area, an orthographic projection of any one of the lead wires on the plane of the display substrate and orthographic projections of other lead wires on the plane of the display substrate having no overlap region.

After the drawings and the detailed descriptions are read and understood, the other aspects may be comprehended.

BRIEF DESCRIPTION OF DRAWINGS

The accompanying drawings provide a further understanding to the technical solution of the present disclosure, form a part of the specification, and are used to explain, together with the embodiments of the present disclosure, the technical solutions of the present disclosure and not intended to form limits to the technical solutions of the present disclosure. The shapes and sizes of each component in the drawings do not reflect the true scale, and are only intended to schematically describe the contents of the present disclosure.

DESCRIPTION ABOUT THE REFERENCE SIGNS

Figure 1:
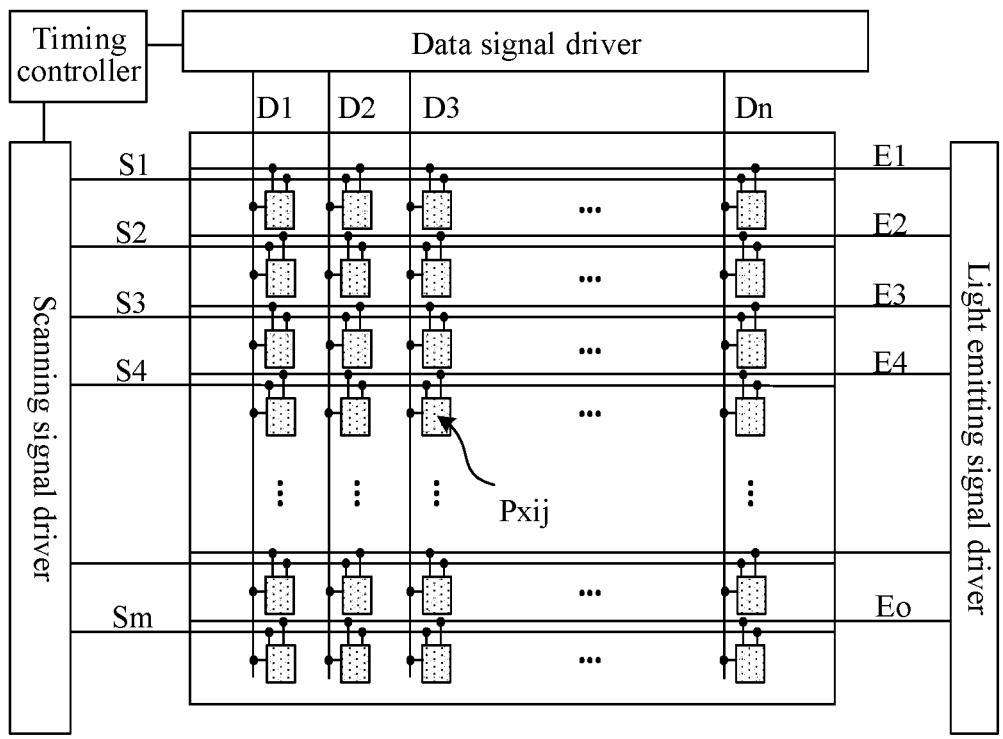
FIG. 1 is a schematic diagram of a structure of a display device.

10—display substrate; 11—first insulating layer; 12—second insulating layer;
13—third insulating layer; 14—fourth insulating layer; 20—integrated circuit;
30—flexible circuit board; 100—display region; 101—substrate;
102—driving circuit layer; 102A—transistor; 102B—memory capacitor;
200—bonding region; 201—first fanout area; 202—bending area;
203—second fanout area; 204—anti-static area; 205—driver chip area;
206—bonding pin area; 300—border region; 301—anode;
302—pixel define layer; 303—organic light-emitting layer; 304—cathode;
401—first encapsulation layer; 402—second encapsulation layer; 403—third encapsulation layer;
500-bonding region; 501-lead area; 502-bending area;
503-composite circuit area; 600-lead wire; and 700-data fanout line.

DETAILED DESCRIPTION

To make the objectives, technical solutions, and advantages of the present disclosure clearer, the embodiments of the present disclosure will be described in detail below in combination with the accompany drawings. It is to be noted that the implementations may be implemented in various forms. Those of ordinary skill in the art can easily understand such a fact that modes and contents may be transformed into various forms without departing from the purpose and scope of the present disclosure. Therefore, the present disclosure should not be explained as being limited to the contents recorded in the following implementations only. If there is no conflicts, the embodiments in the present disclosure and the features in the embodiments can be freely combined. In order to keep the following description of the embodiments of the present disclosure clear and concise, detailed descriptions of part of known functions and known components are omitted in the present disclosure. The accompanying drawings of the embodiments of the present disclosure only involve the structures involved in the embodiments of the present disclosure, and the other structures may refer to conventional designs.

In the accompanying drawings, the size of each composition element, the thicknesses of layers, or regions may be exaggerated sometimes for clarity. Therefore, a mode of the present disclosure is not always limited to the size, and the shape and size of each component in the drawings do not reflect the true scale. In addition, the accompanying drawings schematically illustrate ideal examples, and a mode of the present disclosure is not limited to the shapes, numerical values, or the like shown in the drawings.

Ordinal numerals "first", "second", "third", etc., in the specification are set not to form limits in number but only to avoid the confusion of composition elements.

In the specification, for convenience, expressions "central", "above", "below", "front", "back", "vertical", "horizontal", "top", "bottom", "inside", "outside", etc., indicating orientation or positional relationships are used to illustrate positional relationships between the composition elements referring to the drawings, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where each composition element is described. Therefore, appropriate replacements based on situations are allowed, not limited to the expressions in the specification.

In the specification, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, a channel region refers to a main region that a current flows through.

In the specification, a first electrode may be the drain electrode, and a second electrode may be the source electrode. Alternatively, the first electrode may be a source electrode, and the second electrode may be a drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchangeable in the specification.

In the specification, "electric connection" includes connection of the composition elements through an element with a certain electric action. "An element with a certain electric action" is not particularly limited as long as electric signals between the connected composition elements may be sent and received. Examples of "an element with a certain electric action" not only include an electrode and a wire, but also include a switch element such as a transistor, a resistor, an inductor, a capacitor, another element with various functions, etc.

In the specification, "parallel" refers to a state that an angle formed by two straight lines is larger than −10° and smaller than 10°, and thus may also include a state that the angle is larger than −5° and smaller than 5°. In addition, "perpendicular" refers to a state that an angle formed by two straight lines is larger than 80° and smaller than 100°, and thus may also include a state that the angle is larger than 85° and smaller than 95°.

In the specification, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

FIG. 1 is a schematic diagram of a structure of a display device. As shown in FIG. 1, an OLED display device may include a timing controller, a data signal driver, a scanning signal driver, a light-emitting signal driver, and a pixel array. The pixel array may include a plurality of scanning signal lines (S1 to Sm), a plurality of data lines (D1 to Dn), a plurality of light-emitting signal lines (E1 to Eo), and a plurality of sub-pixels Pxij. In an exemplary implementation, the timing controller may provide a gray-scale value and control signal suitable for a specification of the data signal driver to the data signal driver, may provide a clock signal, a scan starting signal, etc., suitable for a specification of the scanning signal driver to the scanning signal driver, and may provide a clock signal, an emission stopping signal, etc., suitable for a specification of the light-emitting signal driver to the light-emitting signal driver. The data signal driver may generate a data voltage to be provided to data lines D1, D2, D3, . . . to Dn using the gray-scale value and control signal received from the timing controller. For example, the data signal driver may sample the gray-scale value using the clock signal and apply the data voltage corresponding to the gray-scale value to the data lines D1 to Dn taking sub-pixel row as the unit, where n may be a natural number. The scanning signal driver may receive the clock signal, a scan starting signal, etc., from the timing controller to generate a scanning signal to be provided to the scanning lines S1, S2, S3, . . . to Sm. For example, the scanning signal driver may sequentially provide the scanning signal with an on-level pulse to the scanning signal lines S1 to Sm. For example, the scanning signal driver may be constructed in a form of a shift register and sequentially transmit the scan starting signal provided in form of an on-level pulse to a next-stage circuit to generate the scanning signal under the control of the clock signal, where m may be a natural number. The light-emitting signal driver may receive the clock signal, and emit stopping signal, etc., from the timing controller to generate an emission signal to be provided to the light-emitting signal lines E1, E2, E3, . . . to Eo. For example, the light-emitting signal driver may sequentially provide the emission signal with an off-level pulse to the light-emitting signal lines E1 to Eo. For example, the light-emitting signal driver may be constructed into a form of a shift register and can sequentially transmit a light-emitting stopping signal provided in form of an off-level pulse to a next-stage circuit to generate the light-emitting signal under the control of the clock signal, where o may be a natural number. The pixel array may include a plurality of sub-pixels Pxij. Each sub-pixel Pxij may be connected to a corresponding data line, a corresponding scanning signal line, and a corresponding light-emitting signal line, where i and j may be natural numbers. The sub-pixel Pxij may refer to a sub-pixel in which a transistor is connected to an ith scanning signal line as well as a jth data line.

Figure 2:
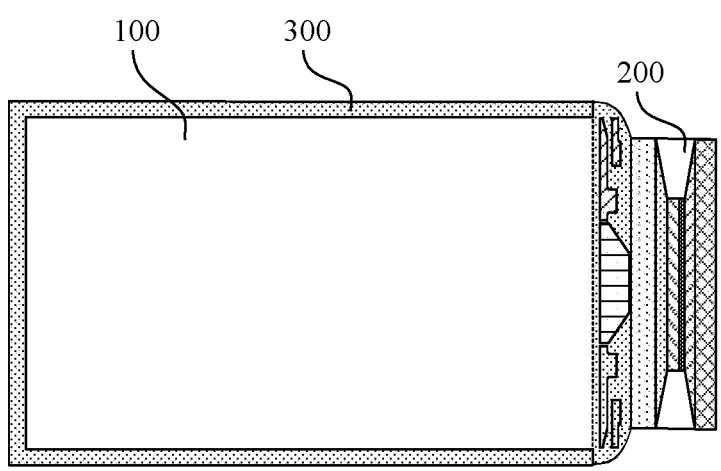
FIG. 2 is a schematic plan view of a display substrate.

FIG. 2 is a schematic plan view of a display substrate. As shown in FIG. 2, the display substrate may include a display region 100, a bonding region 200 on a side of the display region 100, and a border region 300 on other sides of the display region 100. The display region 100 may include a plurality of sub-pixels configured to display a dynamic picture or a static image. The bonding region 200 may include connecting lines and a circuit that connect a plurality of data lines to an integrated circuit. The border region 300 may include a power line for transmitting a voltage signal. The bonding region 200 and the border region 300 may include an isolating dam of a circular structure. At least one side of the border region 300 may be a crimping region formed by bending, or both the display region 100 and the border region 300 are bending or crimping regions. No limits are made hereby in the present disclosure.

Figure 3:
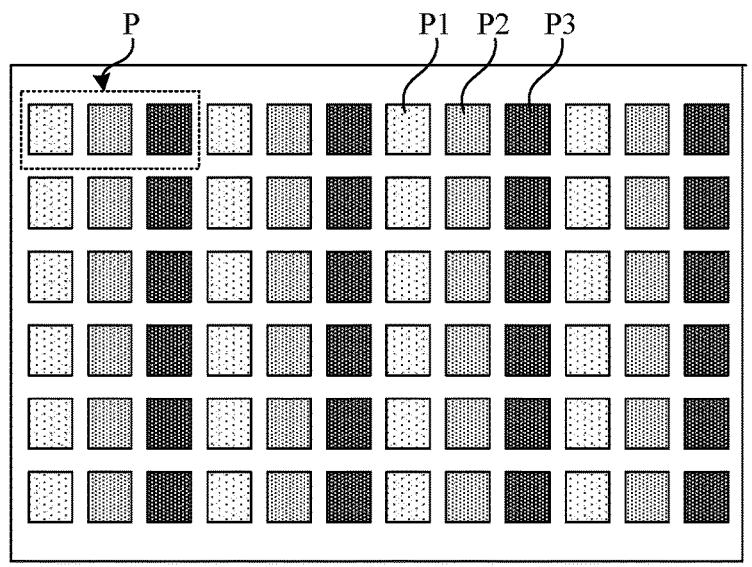
FIG. 3 is a schematic plan view of a display region in a display substrate.

In an exemplary implementation, the display region may include a plurality of pixel units arranged in array. FIG. 3 is a schematic plan view of a display region in a display substrate. As shown in FIG. 3, the display panel may include a plurality of pixel units P arranged in array. At least one of the plurality of pixel units P includes a first sub-pixel P1 that emits first-color light, a second sub-pixel P2 that emits second-color light, and a third sub-pixel P3 that emits third-color light. The first sub-pixel P1, the second sub-pixel P2, and the third sub-pixel P3 are all include a pixel driving circuit and a light emitting device. The pixel driving circuit in each of the first sub-pixel P1, the second sub-pixel P2, and the third sub-pixel P3 is connected to a scanning signal line, a data line, and a light-emitting signal line. The pixel driving circuit is arranged to, under the control of the scanning signal line and the light-emitting signal line, receive a data voltage transmitted by the data line and output a corresponding current to the light emitting device. The light emitting device in each of the first sub-pixel P1, the second sub-pixel P2, and the third sub-pixel P3 is connected to the pixel driving circuit of the sub-pixel where the light emitting device is located in. The light emitting device is arranged to, in response to the current output by the pixel driving circuit of the sub-pixel where it is located in, emit light with a corresponding brightness.

In an exemplary implementation, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited herein in the present disclosure. In an exemplary implementation, a shape of the sub-pixel in the pixel unit may be a rectangle, a rhombus, a pentagon, or a hexagon. When the pixel unit includes three sub-pixels, the three sub-pixels may be arranged in parallel in a horizontal direction, in parallel in a vertical direction, or in a Delta shape. When the pixel unit includes four sub-pixels, the four sub-pixels may be arranged in parallel in the horizontal direction, in parallel in the vertical direction, or in a square. No limits are made herein in the present disclosure.

Figure 4:
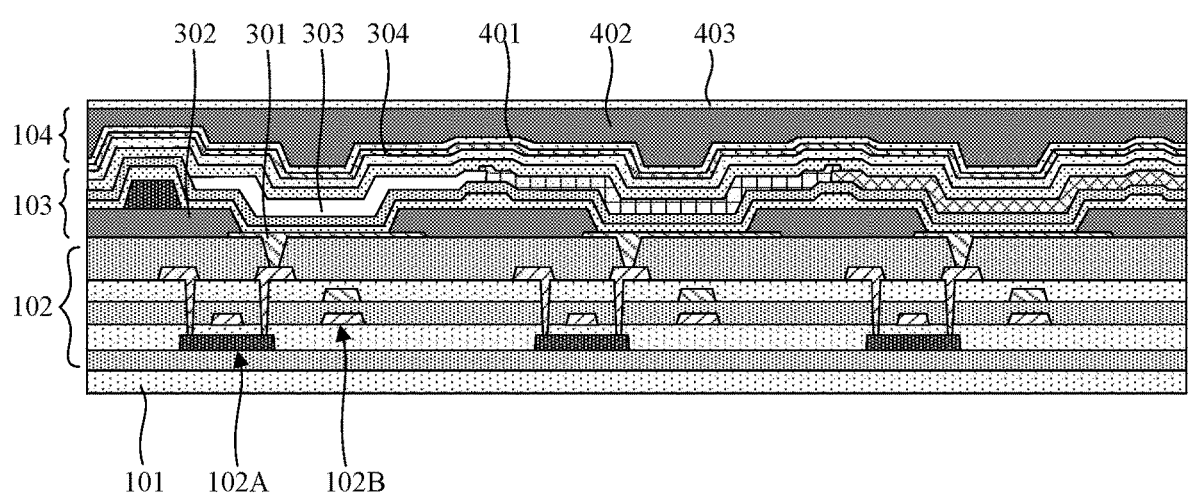
FIG. 4 is a schematic sectional view of a display region in a display substrate.

FIG. 4 is a schematic sectional view of a display region in a display substrate, illustrating the structure of three sub-pixels of an OLED display substrate. As shown in FIG. 4, on a direction perpendicular to the display substrate, the display substrate may include a driving circuit layer 102 arranged on a substrate 101, a light emitting structure layer 103 arranged on a side, away from the substrate 101, of the driving circuit layer 102, and a encapsulation layer 104 arranged on a side, away from the substrate 101, of the light emitting structure layer 103. In some possible implementations, the display substrate may include other film layers, such as a post spacer, which is not limited here in the preset disclosure.

In an exemplary implementation, the substrate 101 may be a flexible substrate, or a rigid substrate. The driving circuit layer 102 of each sub-pixel may include a plurality of transistors and memory capacitors that form a pixel driving circuit. In FIG. 4, only one transistor 102A and one memory capacitor 102B are taken as an example. The light emitting structure layer 103 may include an anode 301, a pixel define layer 302, an organic light emitting layer 303, and a cathode 304. The anode 301 is connected to a drain electrode of a drive transistor 210 through a via. The organic light emitting layer 303 is connected to the anode 301. The cathode 304 is connected to the organic light-emitting layer 303. The organic light-emitting layer 303 is driven by the anode 301 and the cathode 304 to emit light of a corresponding color. The encapsulation layer 104 may include a first encapsulation layer 401, a second encapsulation layer 402, and a third encapsulation layer 403 which are stacked. The first encapsulation layer 401 and the third encapsulation layer 403 may be made of an inorganic material. The second encapsulation layer 402 may be made of an organic material. The second encapsulation layer 402 is arranged between the first encapsulation layer 401 and the third encapsulation layer 403 so that it can be ensured that external water vapor cannot enter the light-emitting structure layer 103.

In an exemplary implementation, the organic light-emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation, the hole injection layers of all the sub-pixels may be connected together to form a through layer; the electron injection layers of all the sub-pixels may be a connected together to form a through layer; the hole transport layers of all the sub-pixels may be connected together to form a through layer; the electron transport layers of all the sub-pixels may be connected together to form a through layer; the hole block layers of all the sub-pixels may be connected together to form a through layer; the light emitting layers of adjacent sub-pixels may have a small overlap, or may be isolated from each other; the electron block layers of the adjacent sub-pixels may have a small overlap, or may be isolated from each other.

Figure 5:
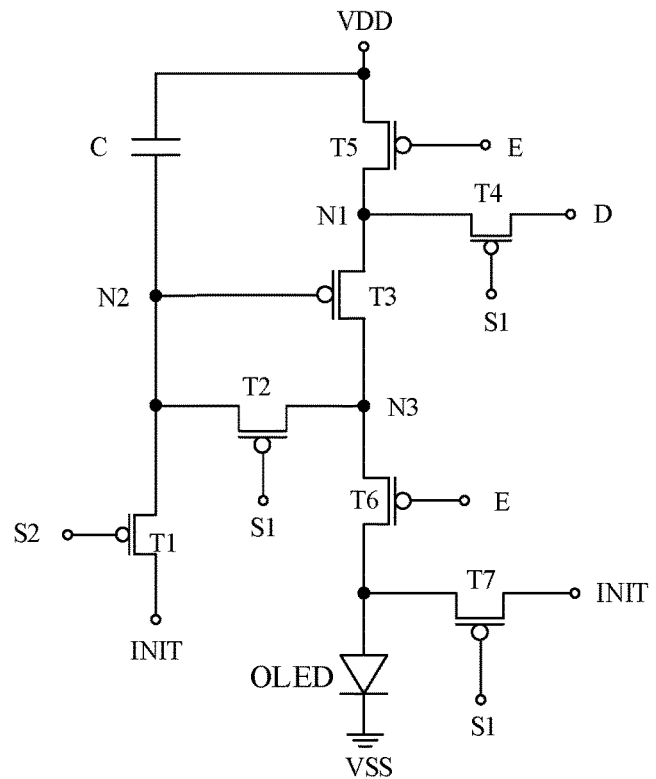
FIG. 5 is an equivalent circuit diagram of a pixel driving circuit.

In an exemplary implementation, the pixel driving circuit may be of a 3T1C, 4T1C, 5T1C, 5T2C, 6T1C, or 7T1C structure. FIG. 5 is an equivalent circuit diagram of a pixel driving circuit. As shown in FIG. 5, the pixel driving circuit may include seven transistors (a first transistor T1 to a seventh transistor T7), a memory capacitor C, and seven signal lines (a signal line D, a first scanning signal line S1, a second scanning signal line S2, a light emitting signal line E, an initial signal line INIT, a first power line VDD, and a second power line VSS).

In an exemplary implementation, a first terminal of the memory capacitor C is connected to the first power line VDD, and a second terminal of the memory capacitor C is connected to a second node N2, that is, the second terminal of the memory capacitor C is connected to a control electrode of a third transistor T3.

A control electrode of the first transistor T1 is connected to the second scanning signal line S2, a first electrode of the first transistor T1 is connected to the initial signal line INIT, and a second electrode of the first transistor is connected to the second node N2. When an on-level scanning signal is applied to the second scanning signal line S2, the first transistor T1 transmits an initial voltage to the control electrode of the third transistor T3 so as to initialize quantity of electric charge of the control electrode of the third transistor T3.

A control electrode of the second transistor T2 is connected to the first scanning signal line S1, a first electrode of the second transistor T2 is connected to the second node N2, and a second electrode of the second transistor T2 is connected to a third node N3. When the on-level scanning signal is applied to the first scanning signal line S1, the second electrode of the third transistor T3 is connected to the control electrode of the third transistor T3 through the second transistor T2.

The control electrode of the third transistor T3 is connected to the second node N2, that is, the control electrode of the third transistor T3 is connected to the second terminal of the memory capacitor C. A first electrode of the third transistor T3 is connected to a first node N1, and a second electrode of the third transistor T3 is connected to the third node N3. The third transistor T3 may be referred to as a drive transistor. The third transistor T3 determines magnitude of a drive current flowing between the first power line VDD and the second power line VSS according to a potential difference between the control electrode and the first electrode of the third transistor T3.

A control electrode of the fourth transistor T4 is connected to the first scanning signal line S1, a first electrode of the fourth transistor T4 is connected to the data line D, and a second electrode of the fourth transistor T4 is connected to the first node N1. The fourth transistor T4 may be referred to as a switch transistor, or a scanning transistor. When the on-level scanning signal is applied to the first scanning signal line S1, the fourth transistor T4 drives to input a data voltage of the data line D to the pixel driving circuit.

A control electrode of the fifth transistor T5 is connected to the light emitting signal line E, a first electrode of the fifth transistor T5 is connected to the first power line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When the on-level light emitting signal is applied to the light emitting signal line E, a drive current path is formed between the first power line VDD and the second power line VSS, the fifth transistor T5 and the sixth transistor T6 drives the light emitting device to emit light through the drive current path.

A control electrode of the seventh transistor T7 is connected to the first scanning signal line S1, a first electrode of the seventh transistor T7 is connected to the initial signal line INIT, and a second electrode of the seventh transistor T7 is connected to the first electrode of the light emitting device. When the on-level scanning signal is applied to the first scanning signal line S1, the seventh transistor T7 transmits to an initial voltage to the first electrode of the light emitting device, so as to initialize the quantity of electric charge accumulated in the first electrode of the light emitting device or release the quantity of electric charge accumulated in the first electrode of the light emitting device.

In an exemplary implementation, a second electrode of the light emitting device is connected to the second power line VSS. A signal of the second power line VSS is a low-level signal. The first power line VDD keeps providing a high level signal. The first scanning signal line S1 is a scanning signal line in the pixel driving circuit of a present display row, and the second scanning signal line S2 is a scanning signal line in the pixel driving circuit of a previous display row. That is, for an nth display row, the first scanning signal line S1 is S(n), and the second scanning signal line S2 is S(n−1). The second scanning signal line S2 of the present display row and the first scanning signal line S1 in the pixel driving circuit of the previous display row are the same signal line. Thus signal lines of the display panel may be reduced, so as to achieve the display panel with narrow bezel.

In an exemplary implementation, the first transistor T1 to the seventh transistor T7 may be P-type transistors or N-type transistors. Adopting the same type of transistors in the pixel driving circuit may simplify a process flow, reduce process difficulties of a display panel, and improve the product yield. In some possible implementations, the first transistor T1 to the seventh transistor T7 may include P-type transistors and N-type transistors.

In an exemplary implementation, the first scanning signal line S1, the second scanning signal line S2, the light emitting signal line E, and the initial signal line INIT extend horizontally, and the second power line VSS, the first power line VDD, and the data line D extend vertically.

In an exemplary implementation, the light emitting device may be an Organic Light-Emitting Diode (OLED), including a first electrode (anode), an organic light-emitting layer, and a second electrode (cathode) that are stacked.

Figure 6:
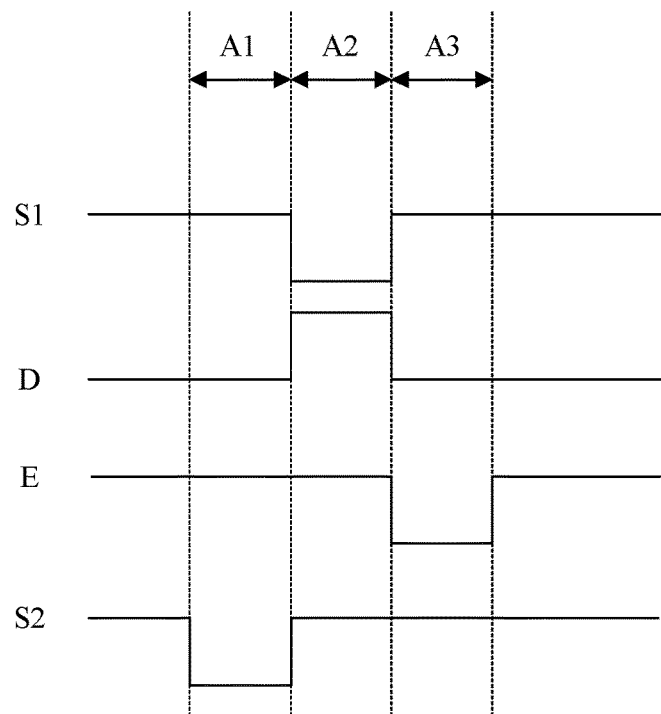
FIG. 6 is a work sequence diagram of a pixel driving circuit.

FIG. 6 is a work sequence diagram of a pixel driving circuit. An exemplary embodiment of the present disclosure will be described through a working process of the pixel driving circuit shown in FIG. 5. As shown in FIG. 5, the pixel driving circuit includes seven transistors (the first transistor T1 to the seventh transistor T7), a memory capacitor C, and seven signal lines (the signal line D, the first scanning signal line S1, the second scanning signal line S2, the light emitting signal line E, the initial signal line INIT, the first power line VDD, and the second power line VSS), and the seven transistors are all P-type transistors.

In an exemplary implementation, the working process of the pixel driving circuit may include the following operations.

In a first stage A1 that is called a reset stage, a signal of the second scanning signal line S2 is a low-level signal, and signals of the first scanning signal line S1 and the light emitting signal line E are high-level signals. The signal of the second scanning signal line S2 is a low-level signal such that the first transistor T1 is switched on, a signal of the initial signal line INIT is provided to the second node N2 to initialize the memory capacitor C, thereby clearing an original data voltage in the memory capacitor. Signals of the first scanning signal line S1 and the light emitting signal line E are high-level signals, which allows the second transistor T2, the fourth transistor T4, the fifth transistor T5, the sixth transistor T6, and the seventh transistor T7 to be cut off. In this stage, the OLED does not emit light.

In a second stage A2 that is called a data writing stage or threshold compensating stage, a signal of the first scanning signal line S1 is a low-level signal, signals of the second scanning signal line S2 and the light emitting signal line E are high-level signals, and the data line D outputs a data voltage. In this stage, the second terminal of the memory capacitor C is of a low level, so that the third transistor T3 is switched on. The signal of the first scanning signal line S1 is a low-level signal, which allows the second transistor T2, the fourth transistor T4, and the are switched on so that the data voltage output by the data line D is provided to the second node N2 through the first node N1, the switched-on third transistor T3, the third node N3, and the switched-on second transistor T2, and a voltage difference between the data voltage output by the data line and a threshold voltage of the third transistor T3 is charged to the memory capacitor C, where a voltage at the second terminal (the second node N2) of the memory capacitor C is Vd−|Vth|, the data voltage output by the data line D is Vd, and the threshold voltage of the third transistor T3 is Vth. The seventh transistor T7 is switched on to provide an initial voltage of the initial signal line INIT to a first electrode of the OLED to initialize (reset) the first electrode of the OLED and clear its internal prestored voltage, thereby completing the initialization to ensure that the OLED does not emit light. The signal of the second scanning signal line S2 is a high-level signal, which allows the first transistor T1 to be cut off. The signal of the light emitting signal line E is a high-level signal, which allows the fifth transistor T5 and the sixth transistor T6 to be cut off.

In a third stage A3 that is called a light emitting stage, the signal of the light emitting signal line E is a low-level signal, and the signals of the first scanning signal line S1 and the second scanning signal line S2 are high-level signals. The signal of the light emitting signal line E is a low-level signal, which allows the fifth transistor T5 and the sixth transistor T6 to be switched on. A supply voltage output by the first power line VDD provides a drive voltage to the first electrode of the OLED through the switched-on fifth transistor T5, the third transistor T3, and the sixth transistor T6, thereby driving the OLED to emit light.

In a drive process of the pixel driving circuit, a drive current flowing through the third transistor T3 (the drive transistor) is determined by a voltage difference between its gate electrode and first electrode. A voltage at the second node N2 is Vdata−|Vth|, so that the drive current of the third transistor T3 is:

$$I=K*(Vgs-Vth)^2=K*[(Vdd-Vd+|Vth|]^2=K*[(Vdd-Vd]^2,$$

where I is the drive current flowing through the third transistor T3, that is, the drive current for driving the OLED, K is a constant, Vgs is the voltage difference between the gate electrode and the first electrode of the third transistor T3, Vth is the threshold voltage of the third transistor T3, Vd is the data voltage output by the data line D, and Vdd is the supply voltage output by the first power line VDD.

Figure 7:
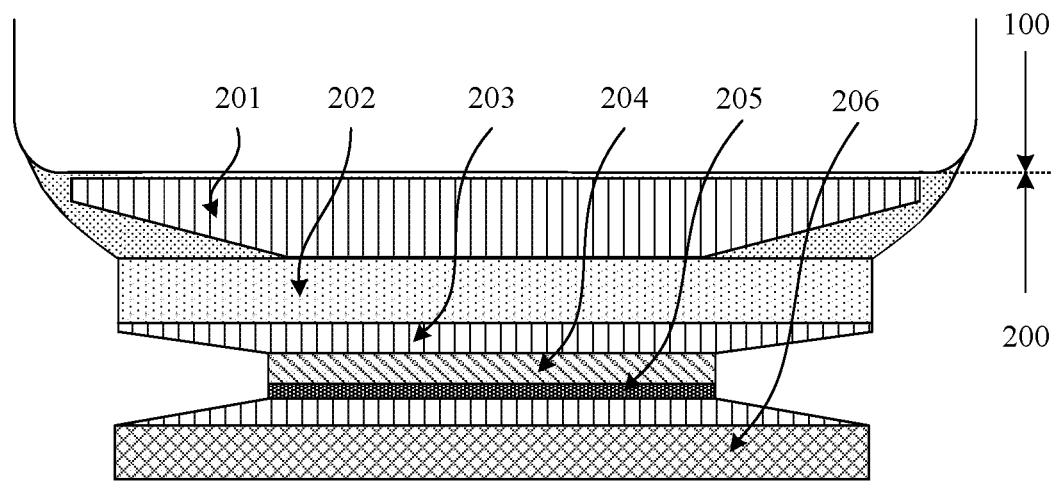
FIG. 7 is a schematic plan view of a bonding region in a display substrate.
Figure 8:
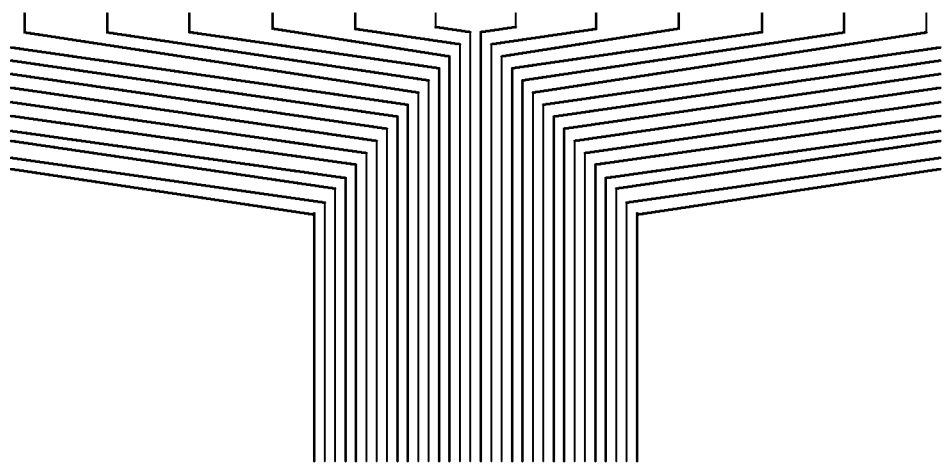
FIG. 8 is a schematic diagram of data fanout lines in a bonding region.

FIG. 7 is a schematic plan view of a bonding region in a display substrate. FIG. 8 is a schematic diagram of data fanout lines in a bonding region. As shown in FIG. 7, in a direction parallel to the display substrate, a bonding region 200 is located on one side of a display region 100. The bonding region 200 may include a first fanout area 201, a bending area 202, a second fanout area 203, an anti-static area 204, a driver chip area 205, and a bonding pin area 206 that are arranged in sequence along a direction away from the display region 100. The first fanout area 201 at least includes data fanout lines. A plurality of data fanout lines are arranged to be connected to Data Lines of the display region in a Fanout wiring manner, as shown in FIG. 8. The bending area 202 includes a composite insulating layer provided with a groove, and is arranged to bend the bonding region 200 to a back surface of the display region 100. The second fanout area 203 includes a plurality of data fanout lines that are led out in a fanout wiring manner. The anti-static area 204 includes an anti-static circuit, and is arranged for removing static electricity to prevent the display substrate from electrostatic damages. The driver chip area 205 includes an Integrated Circuit (IC for short) and is arranged to be connected to the plurality of data fanout lines. The bonding pin area 206 includes a Bonding Pad, and is arranged to be bonded to an external Flexible Printed Circuit (FPC for short).

With the development of OLED display technologies, consumers have higher requirements for the display effect of display products. Super-narrow bezels have become a new trend in the development of display products. Therefore, bezel narrowing or even a bezel-less design has received more attention in the design of OLED display products. At present, a left border, a right border, and an upper border of the display device may be controlled within 1.0 mm. However, the narrowing design of the lower border (a border on a side of the bonding region) is more difficult to implement, which is always maintained at about 2.0 mm. This is because the data fanout lines are usually arranged in the fanout area of the bonding region, where the fanout area has large space occupation. Generally, a width of the bonding region is less than a width of the display region, the signal wires of the integrated circuit and the bonding pad in the bonding region are required to be led into the wider display region through the fanout area in a fanout manner, the greater the width difference between the display region and the bonding region, the more oblique fanout lines in the fanout area, the longer distance between the driver chip area and the display region, and the wider lower border, resulting in the lower border being much larger than the left and right borders.

An exemplary embodiment of the disclosure provides a display substrate. The display substrate may include a display region and a bonding region on a side of the display region. The bonding region at least includes a lead area; the display region includes a plurality of data lines and a plurality of data fanout lines, and the lead area includes a plurality of lead wires. At least one lead wire is connected to the data line through the data fanout line, and orthographic projections of the plurality of data lines and the plurality of data fanout lines on a plane of the display substrate are at least partially overlapped. In the lead area, an orthographic projection of any one of the lead wires on the plane of the display substrate and orthographic projections of other lead wires on the plane of the display substrate have no overlap region.

In an exemplary implementation, at least one lead wire is directly connected to the data line.

In an exemplary implementation, the quantity of the data lines is greater than the quantity of the data fanout lines.

In an exemplary implementation, at least one data fanout line includes a first line segment, a second line segment, and a third line segment; a first end of the first line segment is connected to the lead wire, a second end of the first line segment extends in a direction away from the lead area, to be connected to a first end of the second line segment; a second end of the second line segment extends along a second direction or an opposite direction of the second direction, to be connected to a first end of the third line segment; a second end of the third line segment extends in a direction approaching the lead area, to be connected to the data line through a via; the second direction intersects the first direction, and the first direction is parallel to the data line.

In an exemplary implementation, a plurality of vias through which the data fanout lines are connected to the data lines have the same difference from the edge of the display region; and the edge of the display region is an edge, on a side, close to the lead area, of the display region.

In an exemplary implementation, at least one data fanout line includes a first line segment and a second line segment; a first end of the first line segment is connected to the lead wire, and a second end of the first line segment extends in a direction away from the lead area, to be connected to a first end of the second line segment; and a second end of the second line segment extends along a second direction or the opposite direction of the second direction, to be connected to the data line through a via.

In an exemplary implementation, a plurality of vias through which the data fanout lines are connected to the data lines have different distances from the edge of the display region.

In an exemplary implementation, at least one data fanout line includes a first line segment and a second line segment; a first end of the first line segment is connected to the lead wire, and a second end of the first line segment extends in a direction away from the lead area, to be connected to the second line segment; the second line segment includes a plurality of sub-segments, the plurality of sub-segments are interwoven to form a plurality of grid patterns, the plurality of grid patterns are repeated and consecutively arranged in the first direction and/or the second direction, and at least one sub-segment is connected to the data line through a via.

In an exemplary implementation, the plurality of lead wires in the lead area have the same width, adjacent lead wires have the same spacings, and the width and the spacing are dimensions in the second direction.

In an exemplary implementation, in a direction parallel to the display substrate, the display substrate has a center line, and the center extends along the first direction and equally divides the display region; on a side of the center line, the plurality of data lines include a first data line group and a second data line group, and the plurality of lead wires include a first lead wire group and a second lead wire group.

The first data line group includes a first data line, a second data line, . . . , and an Mth data line that are arranged in sequence along a second direction, the second data line group is arranged on a side of the first data line group in the second direction, the second data line group includes an (M+1)th data line, an (M+2)th data line, . . . , and an Nth data line that are arranged in sequence along the second direction; the first lead group includes a first lead wire, a second lead wire, . . . , and an Mth lead wire that are arranged in sequence along an opposite direction of the second direction, the second lead group includes an (M+1)th lead wire, an (M+2)th lead wire, . . . , and an Nth lead wire that are arranged in sequence along the second direction, the lead wires of the first lead group and the lead wires of the second lead group being alternately arranged; M, and N are positive integers greater than 2, and M is less than N.

The lead wires in the first lead group are connected to the data lines in the first data line group through the data fanout lines, and the lead wires in the second lead group are directly connected to the data lines in the second data line group.

In an exemplary implementation, in a direction perpendicular to the display panel, the display substrate includes a first conductive layer, a second conductive layer, and a third conductive layer, and an insulating layer is arranged between the first conductive layer and the second conductive layer as well as between the second conductive layer and the third conductive layer; and the data lines and the data fanout lines are arranged in different conductive layers.

In an exemplary implementation, the data fanout lines include odd data fanout lines and even data fanout lines, the odd data fanout lines are connected to the data lines in odd columns in the first data line group, and the even data fanout lines are connected to the data lines in even columns in the first data line group; and the odd data fanout lines and the even data fanout lines are arranged in different conductive layers.

In an exemplary implementation, the lead wires include odd lead wires and even lead wires, the odd lead wires are connected to the data lines in odd columns in the first data line group through the odd data fanout lines, or are directly connected to the data lines in odd columns in the second data line group; and the even lead wires are connected to the data lines in even columns in the first data line group through the even data fanout lines, or are directly connected to the data lines in even columns in the second data line group; the odd lead wires and the odd data fanout lines are arranged in the same layer and are of an integrated structure connected to each other, and the even lead wires and the even data fanout lines are arranged in the same layer and are of an integrated structure connected to each other.

In an exemplary implementation, the odd data fanout lines are arranged in the first conductive layer, the even data fanout lines are arranged in the second conductive layer, and the data lines are arranged in the third conductive layer; or, the even data fanout lines are arranged in the first conductive layer, the odd data fanout lines are arranged in the second conductive layer, and the data lines are arranged in the third conductive layer.

In an exemplary implementation, the first conductive layer and the second conductive layer are made of the same material.

Figure 9:
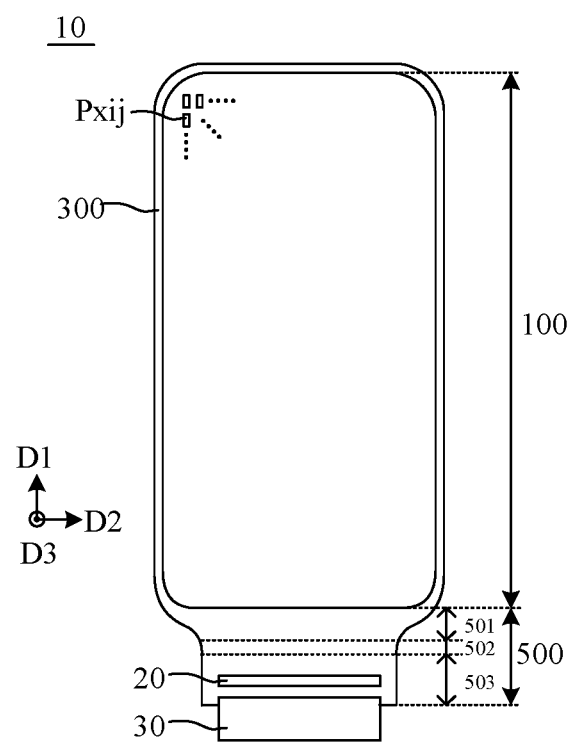
FIG. 9 is a schematic plan view of a display substrate according to an exemplary embodiment of the present disclosure.
Figure 10:
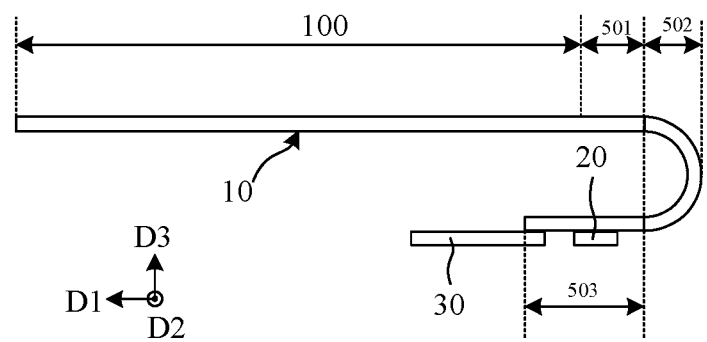
FIG. 10 is a side view of the display substrate in FIG. 9.

FIG. 9 is a schematic plan view of a display substrate according to an exemplary embodiment of the present disclosure. FIG. 10 is a side view of the display substrate in FIG. 9. As shown in FIG. 9 and FIG. 10, the display substrate 10 may include a display region 100, a bonding region 500 on a side, opposite to a first direction D1, of the display region 100, and a border region 300 on other sides of the display region 100. In an exemplary implementation, the display region 100 may be a planarization region, including a plurality of sub-pixels Pxij forming a pixel array, a plurality of data lines, and a plurality of data fanout lines. The plurality of sub-pixels are arranged to display a dynamic picture or a static image; the plurality of data lines are arranged to provide data signals to the plurality of sub-pixels Pxij; the plurality of data fanout lines are correspondingly connected to the plurality of data lines, and are arranged to achieve corresponding connection between the plurality of data lines and a plurality of lead wires in the bonding region 500. In an exemplary implementation, the display substrate may be a flexible substrate, and accordingly the display substrate can be deformed, for example, can be crimped, bent, folded, or curled.

In an exemplary implementation, the bonding region 500 may include a lead area 501, a bending area 502, and a composite circuit area 503 that are arranged in sequence along an opposite direction (a direction away from the display region) of the first direction D1. The lead area 501 is connected to the display region 100, the bending area 502 is connected to the lead area 501, and the composite circuit area 503 is connected to the bending area 502.

In an exemplary implementation, the lead area 501 may be provided with a plurality of lead wires. One end of a part of the plurality of lead wires is correspondingly connected to the plurality of data fanout lines in the display region 100, and the end of the other part of the plurality of lead wires is correspondingly connected to the plurality of data lines in the display region 100, and the other end of the plurality of lead wires cross the bending area 502 to be connected to an integrated circuit of the composite circuit area 503, so that the integrated circuit applies data signals to the data lines through the lead wires and the data fanout lines.

In an exemplary implementation, the bending area 502 may be bent with a curvature in a third direction D3, so that a surface of the composite circuit area 503 may be turned over, that is, the upper surface of the composite circuit area 503 may be turned to face downwards through the bending of the bending area 502, where the third direction D3 intersects the first direction D1. In an exemplary implementation, when the bending area 502 is bent, the composite circuit area 503 may be overlapped with the display region 100 in the third direction D3 (a thickness direction).

In an exemplary implementation, the composite circuit area 503 may include an anti-static area, a driver chip area, and a bonding pin area. An Integrated Circuit (IC for short) 20 may be bonded to the driver chip area, and a Flexible Printed Circuit (FPC for short) 30 may be bonded to the bonding pin area. In an exemplary implementation, the integrated circuit 20 may generate a drive signal required for driving sub-pixels, and may provide a drive signal to the sub-pixels in the display region 100. For example, the drive signal may be a data signal that drives the luminance of the sub-pixels. In an exemplary implementation, the integrated circuit 20 may be bonded to the driver chip area by an anisotropic conductive film or other methods. A width of the integrated circuit 20 in a second direction D2 may be less than a width of the composite circuit area 503 in the second direction D2, where the second direction D2 intersects the first direction D1. In an exemplary implementation, the bonding pin area may be provided with a bonding pad containing a plurality of PINS, and the flexible circuit board 30 may be bonded to the bonding pad.

In an exemplary implementation, the first direction D1 may be an extension direction (a column direction) of the data lines in the display region, the second direction D2 may be an extension direction (a row direction) of the scanning signal lines in the display region, the third direction D3 may be a direction perpendicular to the plane of the display substrate, the first direction D1 and the second direction D2 may be perpendicular to each other, and the first direction D1 and the third direction D3 may be perpendicular to each other.

Figure 11:
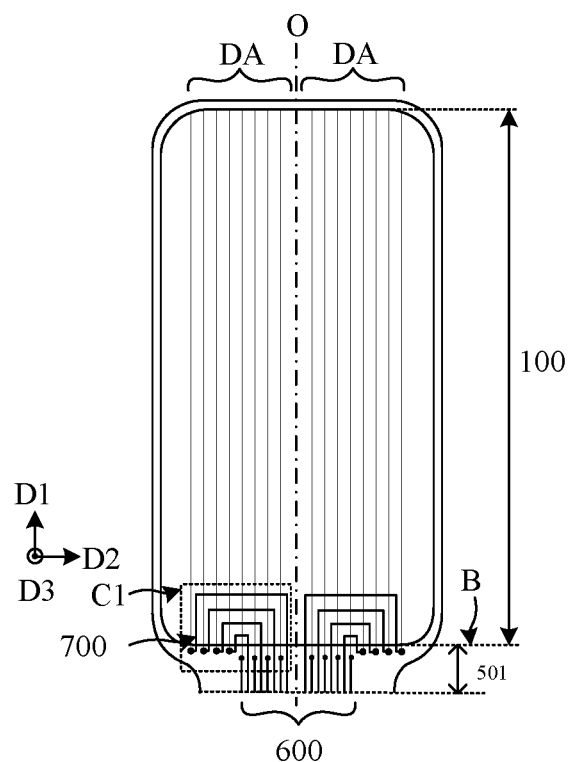
FIG. 11 is a schematic diagram of a structure of a type of lead wires and data fanout lines according to an exemplary embodiment of the present disclosure.

FIG. 11 is a schematic diagram of a structure of a type of lead wires and data fanout lines according to an exemplary embodiment of the present disclosure. As shown in FIG. 11, a display region 100 may include a plurality of sub-pixels that are arranged in array, a plurality of data lines DA, and a plurality of data fanout lines 700. A lead area 501 of the bonding region may include a plurality of lead wires 600. In an exemplary implementation, the plurality of sub-pixels in the display region 100 form a plurality of pixel rows and a plurality of pixel columns; the plurality of data lines DA extend along an opposite direction of a first direction D1, and are sequentially arranged at a set interval along a second direction D2; each data line DA is connected to all sub-pixels of one pixel column in the display region 100; and an end portion of each data line DA extends to a lead area 501 of the bonding region. A first end of each data fanout line 700 is correspondingly connected to a part of the lead wires 600 in the lead area 501. A second end of each data fanout line 700 is correspondingly connected to a part of the data lines DA that extend to the lead area 501. A part of the lead wires 600 in the lead area 501 are connected to the data fanout lines 700, and the other part of the lead wires 600 are correspondingly connected to the other part of the data lines DA that extend to the lead area 501.

In an exemplary implementation, the display substrate has a center line O, and the center line O extends along the first direction D1 and equally divides the plurality of pixel columns of the display region 100. The plurality of data lines DA and a plurality of data fanout lines 700 in the display region 100, and the plurality of lead wires 600 in the lead area 501 of the bonding region may be symmetrically arranged relative to the center line O. That the left side of the display substrate contains N data lines, M data fanout lines, and N lead wires is taken as an example for description below, where N is a positive integer greater than 2, and M is a positive integer greater than 2 and less than N.

In an exemplary implementation, the N data lines on the left side of the display region may include a first data line group and a second line group that are divided by serial numbers. The first data line group may include a first data line DA1, a second data line DA2, . . . , and an Mth data line, and the second data line group may include an (M+1)th data line, an (M+2)th data line, . . . , and an Nth data line.

In an exemplary implementation, M may be the quantity of data lines required to be led out in a fanout manner. For example, when N is an even number, M may be N/2, and when N is an odd number, M may be (N+1)/2, or M may be (N−1)/2. M may be set according to actual requirements, which is not limited in the present disclosure.

In an exemplary implementation, the plurality of data lines of the first data line group are arranged in sequence along the second direction D2 in order of increasing numbers, the plurality of data lines of the second data line group are arranged in sequence along the second direction D2 in order of increasing numbers, and the second data line group is arranged on one side of the first data line group in the second direction D2. That is, the N data lines include a first data line DA1, a second data line DA2, . . . , and an Nth data line DAN that are arranged in sequence along the second direction D2, that is, the serial number of the N data lines gradually increases along the second direction D2. In an exemplary implementation, an ith data line may be a data line located in an ith pixel column, and the ith data line is connected to sub-pixels in the ith pixel column.

In an exemplary implementation, the N lead wires on the left side of the lead area 501 may include a first lead group and a second lead group that are divided by serial numbers. The first lead group may include a first lead wire 601, a second lead wire 602, . . . , and an Mth lead wire. The second lead group may include an (M+1)th lead wire, an (M+2)th lead wire, . . . , and an Nth lead wire.

In an exemplary implementation, the plurality of lead wires of the first lead group are arranged in sequence along an opposite direction of the second direction D2 in order of increasing numbers; the plurality of lead wires of the second lead group are arranged in sequence along the second direction D2 in order of increasing numbers; and the lead wires of the first lead group and the lead wires of the second lead group are alternately arranged. For example, the first lead wire is adjacent to the Nth lead wire, the second lead wire is adjacent to the (N−1)th lead wire, . . . , and the Mth lead wire is adjacent to the (M+1)th lead wire.

In an exemplary implementation, the plurality of lead wires in the first lead group may be correspondingly connected to the plurality of data lines in the first data line group through a plurality of data fanout lines, and the plurality of lead wires in the second lead group may be directly connected to the plurality of data lines in the second data line group correspondingly, so that the lead wires may directly provide data signals to the data lines through the data fanout lines.

In an exemplary implementation, a first end of an ith data fanout line is connected to an ith lead wire at a position near an edge B of the display region, and a second end of the ith data fanout line extends in a direction away from the lead area 501 first, and then returns to the lead area 501, to be connected to the ith data line in the first data line group that extends to the lead area 501, where i=1, 2, . . . , and M. In an exemplary implementation, the edge B of the display region is an edge, on a side, close to the lead area 501, of the display region 100.

In an exemplary implementation, the ith data fanout line may include a first line segment, a second line segment, and a third line segment that are connected in sequence. A first end of the first line segment is located near the edge B of the display region and connected to the ith lead wire. A second end of the first line segment extends in a direction away from the lead area, to be connected to a first end of the second line segment. A second end of the second line segment extends to a position near the ith data line along the second direction D2 or the opposite direction of the second direction D2, to be connected to a first end of the third line segment. A second end of the third line segment extends to the lead area

501 from the display region 100 in a direction approaching the lead area, to be connected to the ith data line extending to the lead area 501.

In an exemplary implementation, the third line segment may include an extending segment and a connecting segment. A first end of the extending segment is located in the display region 100, and is connected to the second end of the second line segment. A second end of the extending segment extends to the edge B of the display region in a direction approaching the lead area, to be connected to a first end of the connecting segment. A second end of the connecting segment extends in a direction away from the display region, to be connected to the ith data line through a via, the ith data line extending to the lead area.

In an exemplary implementation, the connecting segment may be a bent segment, including a vertical line segment parallel to the first direction D1 and a transverse line segment parallel to the second direction D2.

In an exemplary implementation, the plurality of lead wires in the first lead group and the second group may be arranged to be parallel to the first direction D1, that is, the lead wires are parallel to the data lines.

In an exemplary implementation, extension lines, in the first direction D1, of the plurality of data lines in the second data line group may be correspondingly overlapped with the plurality of lead wires in the second lead group.

In an exemplary implementation, the first line segment of each of the plurality of data fanout lines may be arranged to be parallel to the first direction D1, a plurality of second line segments may be arranged to be parallel to the second direction D2, and extending segments of a plurality of third line segments may be arranged to be parallel to the first direction D1. At least one first line segment is arranged between adjacent data lines, and at least one third line segment is arranged between the adjacent data lines.

In an exemplary implementation, a spacing between adjacent first line segments may be the same as a spacing between the adjacent data lines, and a spacing between extending segments of adjacent third line segments may be the same as the spacing between the adjacent data lines, so that a distribution density of the data fanout lines is substantially the same as a distribution density of the data lines.

In an exemplary implementation, a plurality of line segments of a kth data fanout line may form a rectangular wiring, the rectangular wiring formed by the kth data fanout line is within a rectangular wiring formed by a (k−1)th data fanout line, and thus a rectangular nested structure is formed; a distance between a second line segment of the (k−1)th data fanout line and the edge B of the display region is greater than a distance between a second line segment of the kth data fanout line and the edge B of the display region; and a distance between a first line segment and the third line segment of the (k−1)th data fanout line is greater than a distance between a first segment and a third line segment of the kth data fanout line, where k=2, . . . , M.

Figure 12:
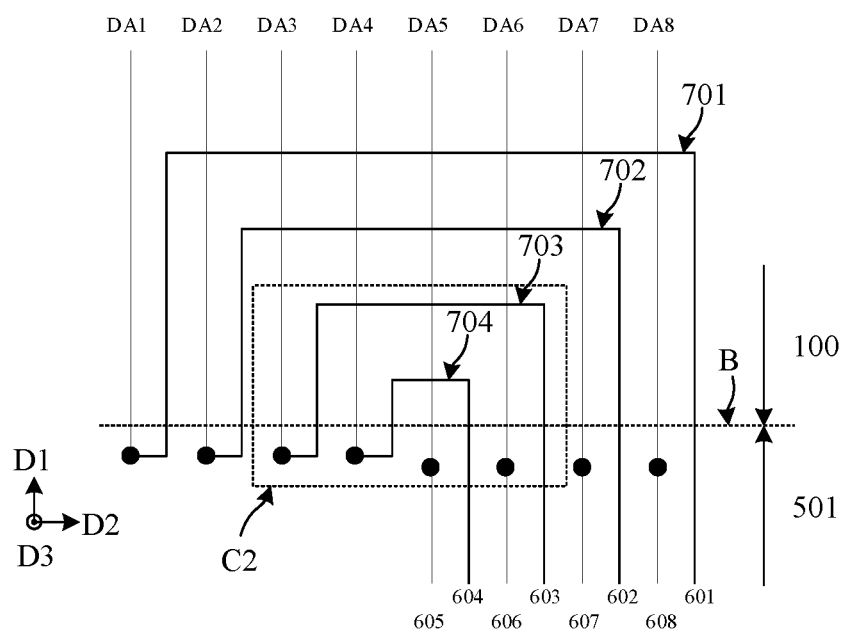
FIG. 12 is an enlarged view of region C1 in FIG. 11.

FIG. 12 is an enlarged view of region C1 in FIG. 11, illustrating the structure of lead wires and data fanout lines when N=8. As shown in FIG. 12, a plurality of data lines may include a first data line DA1, a second data line DA2, a third data line DA3, a fourth data line DA4, a fifth data line DA5, a sixth data line DA6, a seventh data line DA7, and an eighth data line DA8 that are sequentially arranged along the second direction D2; a plurality of lead wires of the lead area 501 of the bonding region may include a first lead wire 601, an eighth lead wire 608, a second lead wire 602, a seventh lead wire 607, a third lead wire 603, a sixth lead wire 606, a fourth lead wire 604, and a fifth lead wire 605 that are sequentially arranged along the opposite direction of the second direction D2.

In an exemplary implementation, a first end of a first data fanout line 701 is connected to the first lead wire 601 at a position near the edge B of the display region through a via; and a second end extends to a position near the first data line DA1 of the display region 100, and then extends to the lead area 501 from the display region 100, to be connected to the first data line DA1 through a via. A first end of a second data fanout line 702 is connected to the second lead wire 602 at a position near the edge B of the display region through a via; and a second end extends to a position near the second data line DA2 of the display region 100, and then extends to the lead wire 501 from the display region 100, to be connected to the second data line DA2 through a via. A first end of a third data fanout line 703 is connected to the third lead wire 603 at a position near the edge B of the display region through a via; and a second end of the third data fanout line 703 extends to a position near the third data line DA3 of the display region 100, and then extends to the lead area 501 from the display region 100, to be connected to the third data line DA3 through a via. A first end of a fourth data fanout line 704 is connected to the fourth lead wire 604 at a position near the edge B of the display region through a via; and a second end of the fourth data fanout line 704 extends to a position near the fourth data line DA4 of the display region 100, and then extends to the lead area 501 from the display region 100, to be connected to the fourth data line DA4 through a via.

In an exemplary implementation, distances between a plurality of vias through which the data fanout lines and the data lines are connected correspondingly and the edge B of the display region are substantially the same, that is, the plurality of vias are located on the same straight line extending along the second direction D2.

In an exemplary implementation, distances between a plurality of vias through which the data fanout lines and the lead wires are connected correspondingly and the edge B of the display region are substantially the same, that is, the plurality of vias are located on the same straight line extending along the second direction D2.

In an exemplary implementation, the fifth data line DA5 extending to the lead area 501 is directly connected to the fifth lead wire 605 through a via; the sixth data line DA6 extending to the lead area 501 is directly connected to the sixth lead wire 606 through a via; the seventh data line DA7 extending to the lead area 501 is directly connected to the seventh lead wire 607 through a via; and the eighth data line DA8 extending to the lead area 501 is directly connected to the eighth lead wire 608 through a via.

In an exemplary implementation, distances between a plurality of vias through which the data lines and the lead wires are connected correspondingly and the edge B of the display region are substantially the same, that is, the plurality of vias are located on the same straight line extending along the second direction D2.

Though the third line segments of the data fanout lines being located on the right side of the corresponding data lines is taken as an example for description in the exemplary embodiment shown in FIG. 12, in the present disclosure, the third line segments of the data fanout lines may be located on the left side of the corresponding data lines, or a part of the third line segments are located on the right side of the data lines, and the other part of the third line segments are located on the left side of the data lines. No limits are made herein in the present disclosure.

Figure 13:
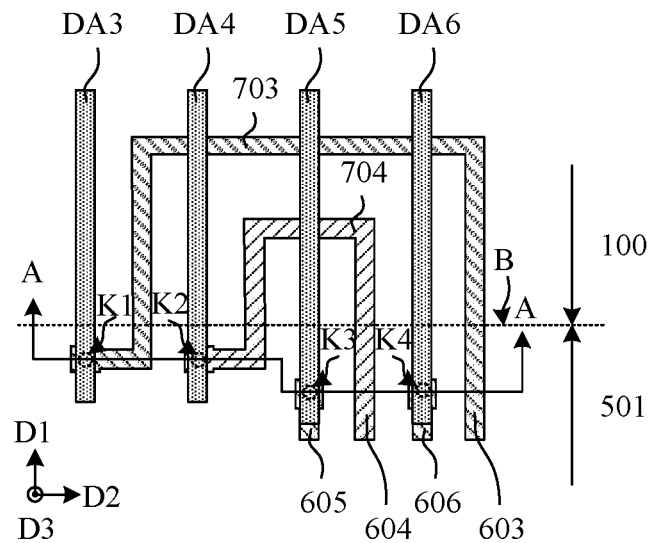
FIG. 13 is an enlarged view of region C2 in FIG. 12.

FIG. 13 is an enlarged view of region C2 in FIG. 12. As shown in FIG. 13, the third data line DA3, the fourth data line DA4, the fifth data line DA5, and the sixth data line DA6 respectively extend to the lead area 501 of the bonding region along the first direction D1. In the lead area 501, the third data fanout line 703 extends to a position near the third data line DA3 of the display region 100 first, and then extends to the lead area 501 from the display region 100, to be connected to an end portion of the third data line DA3 through a first via K1. The fourth data fanout line 704 extends to a position near the fourth data line DA4 of the display region 100 first, and then extends to the lead area 501 from the display region 100, to be connected to an end portion of the fourth data line DA4 through a second via K2. The fifth lead wire 605 is connected to an end portion of the fifth data line DA5 through a third via K3, and the sixth lead wire 606 is connected to an end portion of the sixth data line DA6 through a fourth via K4.

In an exemplary implementation, the data lines and the data fanout lines may be arranged in different film layers, and an insulating layer may be arranged between the data lines and the data fanout lines.

In an exemplary implementation, the lead wires and the data fanout lines may be arranged in the same film layer and formed simultaneously by a same patterning process, and the lead wires and the data fanout lines may be of an integrated structure connected to each other.

In an exemplary implementation, the lead wires and the data fanout lines may be arranged in different film layers, an insulating layer may be arranged between the two, and the two are connected through vias.

In an exemplary implementation, the data lines may include data lines in odd columns and data lines in even columns, the data lines in odd columns are arranged in odd sub-pixel columns, and the data lines in even columns are arranged in even sub-pixel columns. Correspondingly, the data fanout lines may include odd data fanout lines and even data fanout lines, the data fanout lines that are connected to the data lines in odd columns are called odd data fanout lines, and the data fanout lines that are connected to the data lines in even columns are called even data fanout lines. Correspondingly, the lead wires may include odd lead wires and even lead wires, the lead wires that are directly or indirectly connected to the data lines in the odd columns through the odd data fanout lines are called odd lead wires, and the lead wires that are directly or indirectly connected to the data lines in the even columns through the even data fanout lines are called even lead wires.

In an exemplary implementation, the odd data fanout lines and the even data fanout lines may be arranged in the same film layer.

In an exemplary implementation, the odd data fanout lines and the even data fanout lines may be arranged in different film layers, an insulating layer is arranged between the odd data fanout lines and the even data fanout lines, that is, an insulating layer is arranged between the data lines and the odd data fanout lines, an insulating layer is arranged between the data lines and the even data fanout lines, and an insulating layer is arranged between the odd data fanout lines and the even data fanout lines.

In an exemplary implementation, the odd lead wires and the odd data fanout lines may be arranged in the same layer and formed simultaneously by a same patterning process, and the odd lead wires and the odd data fanout lines may be of an integrated structure connected to each other. The even lead wires and the even data fanout lines may be arranged in the same layer and formed simultaneously by a same patterning process. The even lead wires and the even data fanout lines may be of an integrated structure connected to each other.

Figure 14:
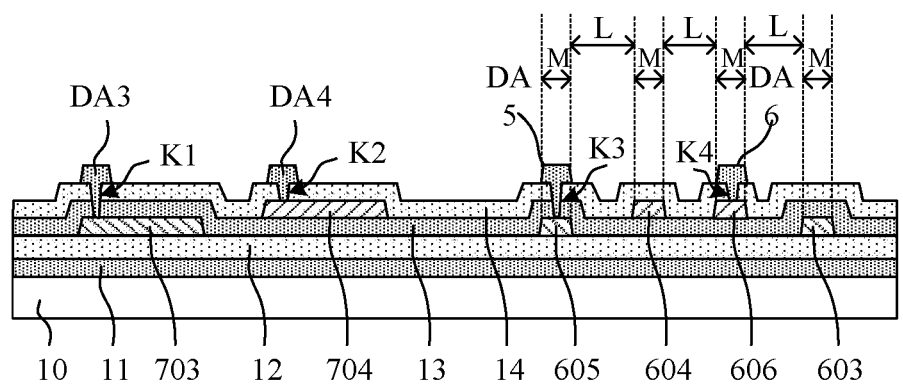
FIG. 14 is a sectional view in direction A-A in FIG. 13.

FIG. 14 is a sectional view in direction A-A in FIG. 13. As shown in FIG. 14, in a direction perpendicular to the display substrate, the display substrate may include a plurality of conductive layers arranged on a substrate, and the plurality of conductive layers may include a first conductive layer, a second conductive layer, and a third conductive layer that are sequentially arranged along a direction away from the substrate. The first conductive layer may include odd lead wires and odd data fanout lines, for example, the third lead wire 603, the fifth lead wire 605, and the third data fanout line 703. The second conductive layer may include even lead wires and even data fanout lines, for example, the fourth lead wires 604, the sixth lead wires 606, and the fourth data fanout line 704. The third conductive layer may include data lines, for example, the third data line DA3, the fourth data line DA4, the fifth data line DA5, and the sixth data line DA6.

In an exemplary implementation, in the direction perpendicular to the display substrate, the display substrate may include a semiconductor layer and a plurality of insulating layers, and the plurality of insulating layers may include a first insulating layer 11, a second insulating layer 12, a third insulating layer 13, and a fourth insulating layer 14 that are sequentially arranged along a direction away from the substrate. In an exemplary embodiment, the first insulating layer 11 is arranged on the substrate 10, the semiconductor layer is arranged on a side, away from the substrate, of the first insulating layer 11; the second insulating layer 12 covers the semiconductor layer; the first conductive layer is arranged on a side, away from the substrate, of the second insulating layer 12; the third insulating layer 13 covers the first conductive layer; the second conductive layer is arranged on a side, away from the substrate, of the third insulating layer 13; the fourth insulating layer 14 covers the second conductive layer; and the third conductive layer is arranged on a side, away from the substrate, of the fourth insulating layer 14.

In an exemplary implementation, an orthographic projection of any one of the lead wires on the substrate and orthographic projections of other lead wires on the substrate have no overlap region, and an orthographic projection of any one of the data fanout lines on the substrate and orthographic projections of other data fanout lines on the substrate have no overlap region.

In an exemplary implementation, the first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayer, or composite. The first insulating layer may be called a Buffer layer and arranged to prevent ionic impurity diffusion, prevent moisture permeation, and execute a surface planarization function. The second insulating layer arranged between the semiconductor layer and the first conductive layer and the third insulating layer arranged between the first conductive layer and the second conductive layer may be called Gate Insulator (GI) layers. The fourth insulating layer arranged between the second conductive layer and the third conductive layer may be called an Interlayer Dielectric (ILD) layer. The first conductive layer, the second conductive layer, and the third conductive layer may be made of a metal material, for example, any one or more of Argentum (Ag), Copper (Cu), Aluminum (Al), Titanium (Ti), and Molybdenum (Mo), or an alloy material of the abovementioned metals, for example, an Aluminum-Neodymium alloy (AlNd) or a Molybdenum-Niobium alloy (MoNb), and may be a single-layer structure, or a multilayer composite structure such as Ti/Al/Ti. The semiconductor layer may be made of amorphous Indium Gallium Zinc Oxide (a-IGZO), zinc oxynitride (ZnON), indium zinc tin oxide (IZTO), amorphous silicon (a-Si), polysilicon (p-Si), sexithiophene, polythiophene, or other materials. That is, the present disclosure is applied to a transistor manufactured based on an oxide technology, a silicon technology, or an organic matter technology. An active layer based on the oxide technology may use an oxide containing indium and tin, an oxide containing tungsten and indium, an oxide containing tungsten and indium and zinc, an oxide containing titanium and indium, and an oxide containing titanium and indium and tin, an oxide containing indium and zinc, an oxide containing silicon, indium and tin, an oxide containing indium, gallium and zinc, and the like.

In an exemplary implementation, in the display region, the semiconductor layer may include active layers of a plurality of transistors, and the first conductive layer may include scanning signal lines, gate electrodes of the plurality of transistors, first capacitor plates, odd lead wires, and odd data fanout lines; the second conductive layer may include second capacitor plates, even lead wires, and even data fanout lines; and the third conductive layer may include data lines, and source and drain electrodes of the plurality of transistors.

In the bonding region, the first conductive layer may include odd lead wires, the second conductive layer may include even lead wires, and the third conductive layer may include data lines.

In an exemplary implementation, the third insulating layer 13 and the fourth insulating layer 14 may be provided with a plurality of first vias K1, the plurality of first vias K1 are located at end portions of the odd data fanout lines, and portions of the third insulating layer 13 and the fourth insulating layer 14 in the first vias K1 are etched, so that surfaces of the odd data fanout lines are exposed. The first vias K1 are arranged such that the data lines in odd columns formed subsequently are connected to the odd data fanout lines through the vias.

In an exemplary implementation, the fourth insulating layer 14 may be provided with a plurality of second vias K2, the plurality of second vias K2 are located at end portions of the even data fanout lines, and portions of the fourth insulating layer 14 in the second vias K2 are etched, so that surfaces of the even data fanout lines are exposed. The second vias K2 are arranged such that the data lines in even columns formed subsequently are correspondingly connected to the even data fanout lines through the vias.

In an exemplary implementation, the third insulating layer 13 and the fourth insulating layer 14 may be provided with a plurality of third vias K3, the plurality of third vias K3 are located at end portions of the odd lead wires in the lead area 501, and portions of the third insulating layer 13 and the fourth insulating layer 14 in the third vias K3 are etched, so that surfaces of the odd lead wires are exposed. The third vias K3 are arranged such that the data lines in odd columns formed subsequently are connected to the odd lead wires through the vias.

In an exemplary implementation, the fourth insulating layer 14 may be provided with a plurality of fourth vias K4, the plurality of fourth vias K4 are located at end portions of the even lead wires in the lead area 501, and portions of the fourth insulating layer 14 in the fourth vias K4 are etched, so that surfaces of the even lead wires are exposed. The fourth vias K4 are arranged such that the data lines in even columns formed subsequently are correspondingly connected to the even lead wires through the vias.

A preparation process of the display substrate will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for the organic material. Deposition may be any one or more of sputtering, evaporation, and chemical vapor deposition. Coating may be any one or more of spray coating, spin coating, and ink-jet printing. Etching may be any one or more of dry etching and wet etching. No limits are made in the present disclosure. "Thin film" refers to a thin film layer prepared from a certain material on a substrate by a process such as depositing, coating, or the like. If the patterning process on the "thin film" is omitted in the entire preparation process, the "thin film" may be still called "layer". If the patterning process on the "thin film" is required in the entire preparation process, it is called "thin film" before the patterning process, and called "layer" after the patterning process. The "layer" obtained after the patterning process includes at least one "pattern". In the present disclosure, "A and B are arranged in the same layer" means that A and B are formed simultaneously through a same patterning process, where a "thickness" of the film layer is a dimension of the film layer in a direction perpendicular to the display substrate. In the embodiment of the present disclosure, "an orthographic projection of A includes an orthographic projection of B" or "an orthographic projection of B is within a range of an orthographic projection of A" means an edge of a display region of the orthographic projection of B falls within an edge range of a display region of the orthographic projection of A, or an edge of a display region of the orthographic projection of A and an edge of a display region of the orthographic projection of B are overlapped with each other.

In an exemplary implementation, the preparation process of the display substrate may include the following operations.

(1) A semiconductor layer pattern is formed on the substrate. In an exemplary implementation, the operation that a semiconductor layer pattern is formed on the substrate may include: a first insulating thin film and a semiconductor layer thin film are sequentially deposited on the substrate, and the semiconductor layer thin film is patterned through the patterning process to form a first insulating layer that covers the whole substrate and form the semiconductor layer pattern arranged on the first insulating layer, where the semiconductor layer pattern at least includes active layers of the plurality of transistors. In an exemplary implementation, the substrate may be a flexible substrate.

(2) A first conductive layer pattern is formed. In an exemplary implementation, the operation that a first conductive layer is formed may include: a second insulating thin film and a first metal thin film are sequentially deposited on the substrate on which the above-mentioned pattern is formed, and the first metal thin film is patterned through the patterning process to form a second insulating layer that covers the semiconductor layer pattern and form a first conductive layer pattern arranged on the second insulating layer, where the first conductive layer pattern includes at least a plurality of odd data fanout lines, a plurality of scanning signal lines, and gate electrodes of a plurality of transistor, and a plurality of first capacitor electrodes that are located in the display region, and a plurality of odd lead wires that are located in the lead area of the bonding region, and the odd data fanout lines and the odd lead wires may be of an integrated structure connected to each other.

(3) A second conductive layer pattern is formed. In an exemplary implementation, the operation that the second conductive layer pattern is formed may include: a third insulating thin film and a second metal thin film are sequentially deposited on the substrate on which the above-mentioned pattern is formed, and the second metal film is patterned through the patterning process to form a third insulating layer that covers the first conductive layer pattern, and form a second conductive layer pattern arranged on the third insulating layer, where the second conductive layer pattern at least includes a plurality of even data fanout lines and a plurality of second capacitor electrodes that are located in the display region, and a plurality of even lead wires located in the lead area of the bonding region, and the even data fanout lines and the even lead wires may be of an integrated structure connected to each other.

(4) A fourth insulating layer pattern is formed. In an exemplary implementation, the operation that a fourth insulating layer pattern is formed may include: a fourth insulating thin film is deposited on the substrate on which the above-mentioned pattern is formed, and the fourth insulating thin film is patterned through the patterning process to form a fourth insulating layer that covers the second conductive layer pattern, where the fourth insulating layer is provided with a plurality of vias, the plurality of vias may include active vias at positions of a plurality of active layers in the display region, and a plurality of first vias, second vias, third vias, and fourth vias that are located in the lead area. The active layers are exposed from the active vias, the odd data fanout lines are exposed from the first vias, the even data fanout lines are exposed from the second vias, the odd lead wires are exposed from the third vias, and the even lead wires are exposed from the fourth vias.

(5) A third conductive layer pattern is formed. In an exemplary implementation, the operation that the third conductive layer pattern is formed may include: a third metal thin film is deposited on the substrate on which the above-mentioned pattern is formed, and the third metal thin film is patterned through the patterning process to form a third conductive layer pattern on the fourth insulating layer. The third conductive layer pattern at least includes: a plurality of data lines and sources electrodes and drain electrodes of a plurality of transistors; and the source electrodes and the drain electrodes are respectively connected to the corresponding active layers through the active vias. The plurality of data lines extend to the lead area of the bonding region. The data lines in odd columns in the first data line group are connected to the odd data fanout lines through the first vias, and the data lines in even columns in the first data line group are connected to the even data fanout lines through the second vias. The data lines in odd columns in the second data line group are connected to the odd lead wires through the third vias, and the data lines in even columns in the second data line group are connected to the even lead wires through the fourth vias.

In an exemplary implementation, the preparation of the display substrate may further include forming of a light emitting structure layer and an encapsulation layer, and the like, which will not be elaborated here.

In an exemplary implementation, the first conductive layer and the second conductive layer may be made of the same metal material, for example, Molybdenum (Mo), the lead wires have the same width M, adjacent lead wires have the same spacing L, and the width M and the spacing L are both dimensions in the second direction D2. In an exemplary implementation, the width of each data fanout line may be the same.

Although the foregoing exemplary embodiment shown in FIG. 14 has been described by taking the odd data fanout lines arranged on the first conductive layer, the even data fanout lines arranged on the second conductive layer, and the data lines arranged on the third conductive layer as an example for description, in the present disclosure, the odd data fanout lines, even data fanout lines, and data lines can be arranged in any layer, as long as it is ensured that the data signal lines and data fanout lines are located in the different conductive layers. No limits are made thereto in the present disclosure.

The structure of the display substrate and its preparation process in the present disclosure are only exemplary description. In an exemplary implementation, variation of corresponding structures and addition or reduction of the patterning process may be performed as practically required, which is not limited in the present disclosure.

In a display substrate, the bonding region is provided with a fanout area, and the data lines of the display region are led out through the data fanout lines of the fanout area. More oblique lines in the fanout area result in the wider lower border, which is not conducive to implementation of a narrow bezel. In the exemplary embodiment of the present disclosure, the lead wires are arranged in the lead area of the bonding region, the data fanout lines are arranged in the display region, and the lead wires are connected to the corresponding data signal lines through the data fanout lines, so that corresponding connection between the plurality of lead wires and the plurality of data signal lines is implemented, and the oblique lines formed in a fan shape are omitted from the lead area. The plurality of lead wires are vertical lines parallel to each other, which can be directly led into the composite circuit area of the bonding area, effectively reducing the length of the lead area in a vertical direction greatly, greatly reducing the width of the lower border, allowing the widths of the upper boarder, the lower border, the left border, and the right border of the display device to be similar and all below 1.0 mm, increasing a screen-to-body ratio, and facilitating the implementation of a bezel-less display.

In the exemplary embodiment of the present disclosure, the adjacent data fanout lines and lead wires are respectively arranged in two different film layers, and the data fanout lines and the lead wires are alternatively arranged in the two film layers, so that the spacing between the adjacent data fanout lines as well as the lead wires is effectively reduced, connection reliability is effectively improved, and the width of the lower border may be further reduced. In the present disclosure, the data fanout lines and the lead wires arranged in the two film layers are made of the same material, the width of each data fanout line and the width of each lead wire are the same, and the spacing between the adjacent lead wires is the same, so that dimension deviation of the two film layers is effectively avoided. The data lines may be connected to the data fanout lines and the lead wires in any film layer, so that the lead wires in the lead area are not required to be bent or crossed. Moreover, the data fanout lines and the lead wires that are alternately arranged in the two film layers have substantially the same electrical characteristics, thereby effectively improving display uniformity and display quality.

Figure 15:
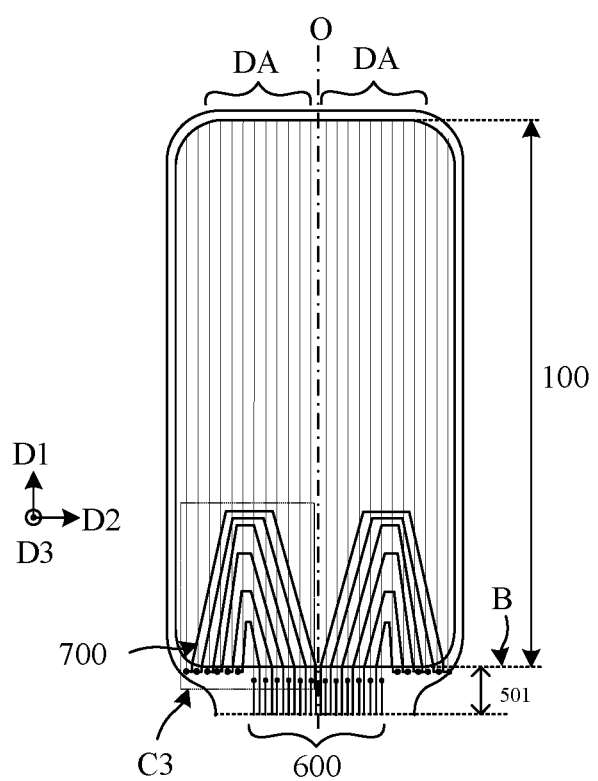
FIG. 15 is schematic diagram of a structure of another type of lead wires and data fanout lines according to an exemplary embodiment of the present disclosure.
Figure 16:
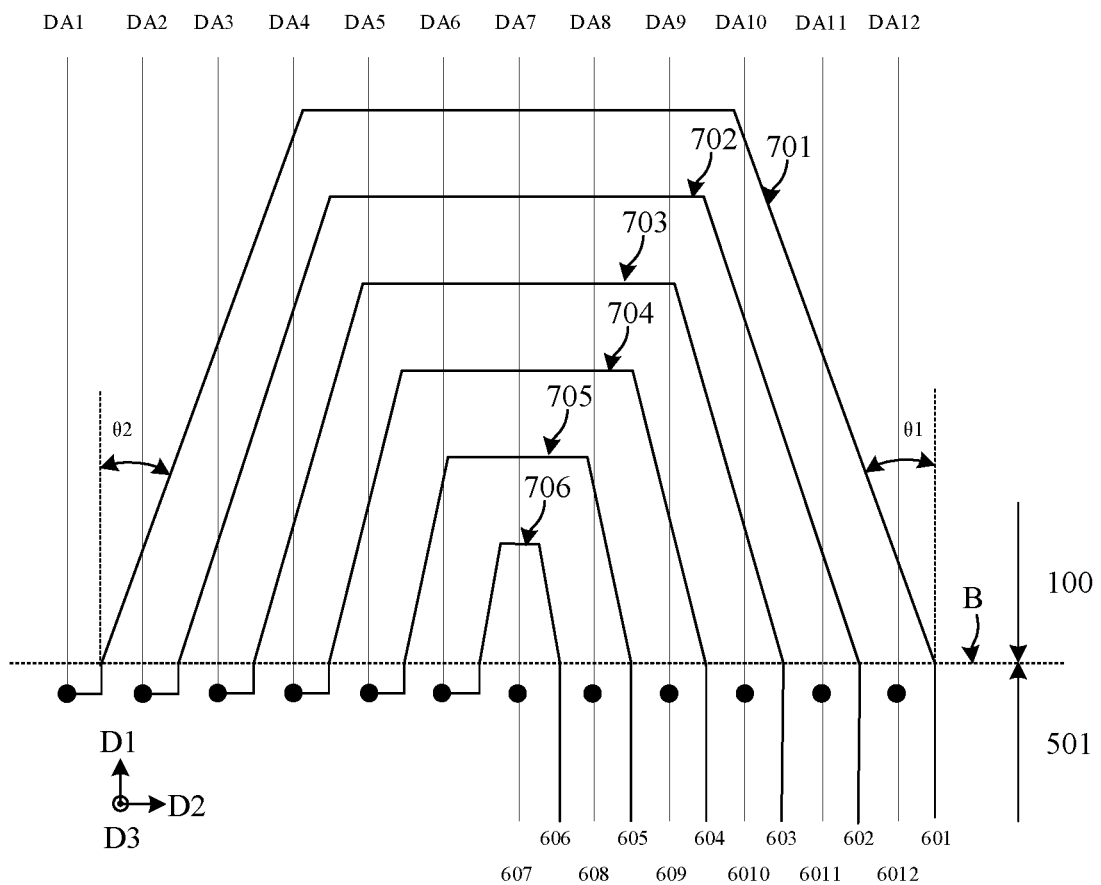
FIG. 16 is an enlarged view of region C3 in FIG. 15.

FIG. 15 is schematic structural diagram of another type of lead wires and data fanout lines according to an exemplary embodiment of the present disclosure. FIG. 16 is an enlarged view of region C3 in FIG. 15. As shown in FIG. 15 and FIG. 16, a plurality of data lines DA and a plurality of data fanout lines 700 in a display region 100, and a plurality of lead wires 600 in a lead area 501 may be symmetrically arranged relative to a center line O. That the left side of the display substrate contains twelve (i.e., N=12) data lines, six data fanout lines, and twelve lead wires is taken as an example for description below.

In an exemplary implementation, the first data line group may include a first data line DA1 to sixth data line DA6, and the second data line group may include a seventh data line DA7 to a twelfth data line DA12. The first lead group may include a first lead wire 601 to a sixth lead wire 606, the second lead group may include a seventh lead wire 607 to the twelfth lead wire 6012, and the six data fanout lines may include a first data fanout line 701 to a sixth data fanout line 706.

In an exemplary implementation, a plurality of data lines of the first data line group are arranged in sequence along a second direction D2 in order of increasing numbers; and a plurality of lead wires of the first lead group are arranged in sequence along an opposite direction of the second direction D2 in order of increasing numbers. A plurality of data lines of the second data line group are arranged in sequence along the second direction D2 in order of increasing numbers, and the second data line group is arranged on one side of the first data line group in the second direction D2. A plurality of lead wires of the second lead group are arranged in sequence along the second direction D2 in order of increasing numbers; and the lead wires of the first lead group and the lead wires of the second lead group are alternately arranged.

In an exemplary implementation, a first end of each of the six data fanout lines is connected to one of the six lead wires in the first lead group at a position near an edge B of the display region respectively, and a second end of each of the six data fanout lines extends in a direction away from the lead area 501 first, and then returns to the lead area 501, to be correspondingly connected to one of the six data lines in the first data line group that extends to the lead area 501. The six data lines in the second data line group extend to the lead wire 501, to be correspondingly directly connected to the six lead wires in the second lead group.

In an exemplary implementation, an ith data fanout line may include a first line segment, a second line segment, and a third line segment that are connected in sequence. A first end of the first line segment is located near the edge B of the display region and connected to the ith lead wire. A second end of the first line segment extends in a direction away from the lead area, to be connected to a first end of the second line segment. A first included angle θ1 is formed between the first line segment and the first direction D1, and the first included angle θ1 may be greater than 0° and less than 90°. A second end of the second line segment extends along the second direction D2 or the opposite direction of the second direction D2, to be connected to a first end of the third line segment. A second end of the third line segment extends to the lead area 501 from the display region 100 in a direction approaching the lead area, to be connected to an ith data line of the lead area 501.

In an exemplary implementation, the third line segment may include an extending segment and a connecting segment. A first end of the extending segment is located in the display region 100, and is connected to the second end of the second line segment. A second end of the extending segment extends to the edge B of the display region in a direction approaching the lead area, to be connected to a first end of the connecting segment. A second end of the connecting segment extends in a direction away from the display region, to be connected to the ith data line through a via, the ith data line extending to the lead area. A second included angle θ2 is formed between the extending segment of the third line segment and the first direction D1, and the second included angle θ2 may be about greater than 0° and less than 90°, where i=1, 2, 3, 4, 5, 6.

In an exemplary implementation, the connecting segment may be a bent segment, including a vertical line segment parallel to the first direction D1 and a transverse line segment parallel to the second direction D2.

In an exemplary implementation, the first included angle θ1 and the second included angle η2 may be about 20° to 70°; and the first included angle θ1 and the second induced angle θ2 may be the same or different.

In an exemplary implementation, a plurality of line segments of a kth data fanout line may form a trapezoidal wiring, the trapezoidal wiring formed by the kth data fanout line is within a trapezoidal wiring formed by a (k−1)th data fanout line, so that a trapezoidal nested structure is formed; a distance between a second line segment of the (k−1)th data fanout line and the edge B of the display region is greater than a distance between a second line segment of the kth data fanout line and the edge B of the display region, where k=2, 3, 4, 5, 6.

In an exemplary implementation, the seventh lead wire 607 to the twelfth lead wire 6012 are respectively directly connected to the seventh data line DA7 to the twelfth data line DA12 that extend to the lead area 501.

In an exemplary implementation, the plurality of lead wires in the first lead group and the second group may be arranged to be parallel to the first direction D1. Extension lines, in the first direction D1, of the plurality of data lines in the second data line group may be correspondingly overlapped with the plurality of lead wires in the second lead group.

In an exemplary implementation, an orthographic projection of any one of the lead wires on the substrate and orthographic projections of other lead wires on the substrate have no overlap region, and an orthographic projection of any one of the data fanout lines on the substrate and orthographic projections of other data fanout lines on the substrate have no overlap region.

In the exemplary embodiment, the film layer structure of the data lines, the data fanout lines, and the lead wires may be similar to that in the foregoing exemplary embodiment, and will not be repeated here.

According to the exemplary embodiment of the present disclosure, the technical effects of the foregoing embodiments can be achieved, including effectively narrowing the lower border, effectively avoiding size deviation of two film layers, and effectively improving display uniformity and display quality. In addition, in the present disclosure, the data fanout lines forming the trapezoidal wiring in the display region, so that a space of the display region is fully utilized, interference to the data lines can be avoided, and display performance is effectively improved.

Figure 17:
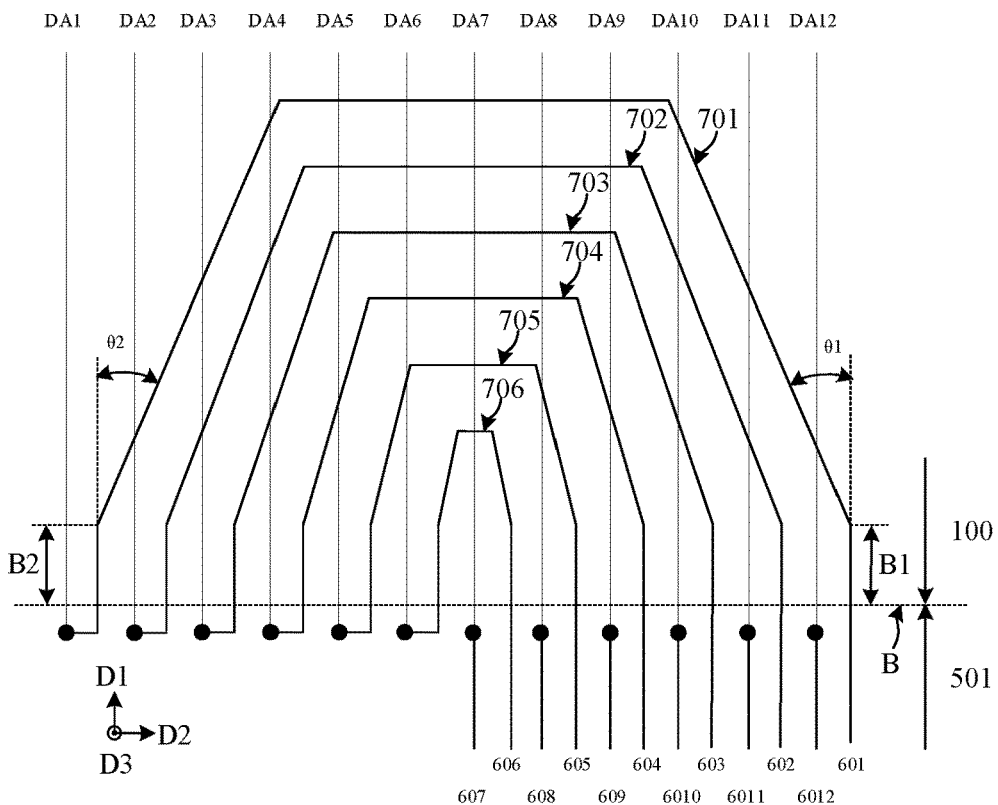
FIG. 17 is a schematic diagram of a structure of still another type of lead wires and data fanout lines according to an exemplary embodiment of the present disclosure.

FIG. 17 is schematic diagram of a structure of still another type of lead wires and data fanout lines according to an exemplary embodiment of the present disclosure, and is an enlarged view of region C3 in FIG. 15. The structure of the lead wires and the data fanout lines according to the exemplary embodiment is similar to the structure of the embodiment shown in FIG. 16. The difference lies in that the extensions of the first line segment and the third line segment can be bent lines, and the data fanout lines form a polygonal wiring.

In an implementation, the first line segment may include a first straight line segment and a first oblique line segment. A first end of the first straight line segment is located near the edge B of the display region and connected to a lead wire. A second end of the first straight line segment extends a certain distance along the first direction D1, to be connected to a first end of the first oblique line segment. The first oblique line segment extends along a direction away from the lead area, to be connected to a first end of the second line segment. A first included angle θ1 is formed between the first oblique line segment and the first direction D1, and the first included angle θ1 may be greater than 0° and less than 90°. A distance B1 from the second end of the first straight line segment to the edge B of the display region may be arranged according to needs.

In an exemplary implementation, the third line segment may include an extending segment and a connecting segment. A first end of the extending segment is located in the display region 100, and is connected to the second end of the second line segment. A second end of the extending segment extends to the edge B of the display region in a direction approaching the lead area, to be connected to a first end of the connecting segment. A second end of the connecting segment extends in a direction away from the display region, to be connected to the data line through a via, the data line extending to the lead area. In an exemplary implementation, the connecting segment may be a bent segment, including a vertical line segment parallel to the first direction D1 and a transverse line segment parallel to the second direction D2.

In an exemplary implementation, the extending segment of the third line segment may include a third oblique line segment and a third straight line segment. A first end of the third oblique line segment is located in the display region 100, and is connected to the second end of the second line segment. A second end of the third oblique line segment extends in a direction approaching the lead area, to be connected to a first end of the third straight line segment. A second end of the third straight line segment extends to the edge B of the display region along the opposite direction of the first direction D1, to be connected to a first end of the connecting segment. A second included angle θ2 is formed between the third oblique line segment and the first direction D1, and the second included angle θ2 may be greater than 0° and less than 90°. A distance B2 from the first end of the third straight line segment to the edge B of the display region may be arranged according to needs.

In an exemplary implementation, a plurality of line segments of a kth data fanout line may form a polygonal wiring, the polygonal wiring formed by the kth data fanout line is within a polygonal wiring formed by a (k−1)th data fanout line, and thus a polygonal nested structure is formed; a distance between a second line segment of the (k−1)th data fanout line and the edge B of the display region is greater than a distance between a second line segment of the kth data fanout line and the edge B of the display region, where k=2, 3, 4, 5, 6.

According to the exemplary embodiment of the present disclosure, the technical effects of the foregoing embodiments can be achieved, including effectively narrowing the lower border, effectively avoiding size deviation of two film layers, and effectively improving display uniformity and display quality. In addition, in the present disclosure, the polygonal wiring is formed in the display region, so that a space of the display region is fully utilized, and interference to the data lines can be avoided. The data fanout lines are set as vertical lines in a region, close to the lead area, of the display region, which is conductive to reducing the difficulty in wiring design.

Figure 18:
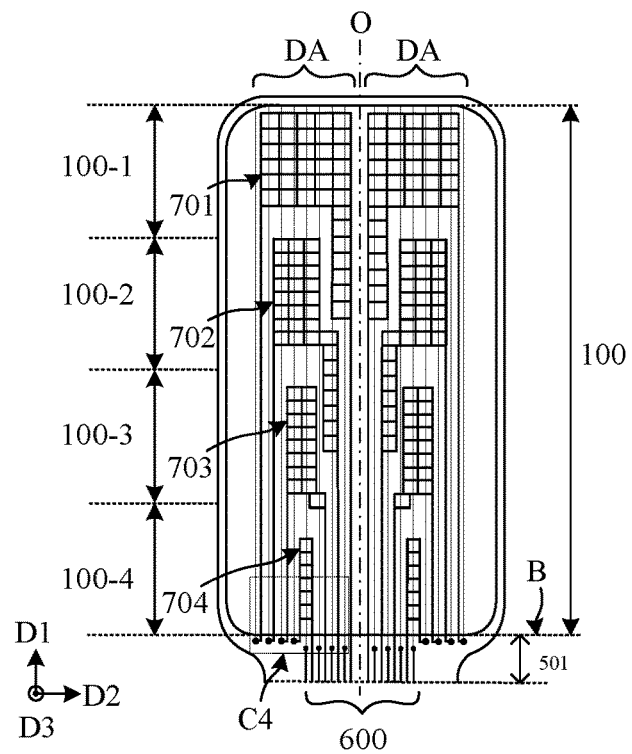
FIG. 18 is a schematic diagram of a structure of still another type of lead wires and data fanout lines according to an exemplary embodiment of the present disclosure.
Figure 19:
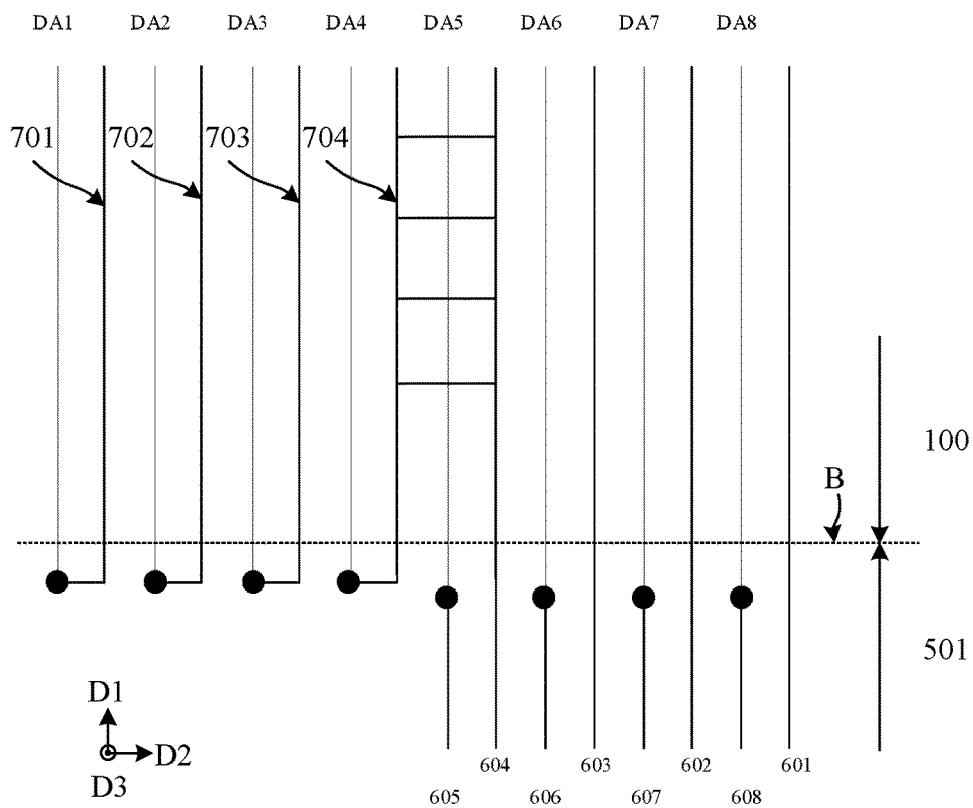
FIG. 19 is an enlarged view of region C4 in FIG. 18.

FIG. 18 is schematic diagram of a structure of still another type of lead wires and data fanout lines according to an exemplary embodiment of the present disclosure. FIG. 19 is an enlarged view of region C4 in FIG. 18. As shown in FIG. 18 and FIG. 19, a plurality of data lines and a plurality of data fanout lines in a display region 100, and a plurality of lead wires in a lead area 501 may be symmetrically arranged relative to a center line O. That the left side of the display substrate contains eight (i.e., N=8) data lines, four data fanout lines, and eight lead wires is taken as an example for description below.

In an exemplary implementation, the arrangement of the eight data lines on the left side of the display region and the eight lead wires on the left side of the lead area 501 may be similar to that in the foregoing embodiment; the plurality of lead wires in the first lead group may be correspondingly connected to the plurality of data lines in the first data line group through a plurality of data fanout lines, and the plurality of lead wires in the second lead group may be directly correspondingly connected to the plurality of data lines in the second data line group.

In an exemplary implementation, an ith data fanout line may include a first line segment, a second line segment and a third line segment that are connected in sequence. A first end of the first line segment is located near the edge B of the display region and connected to an ith lead wire. A second end of the first line segment extends in a direction away from the lead area, to be connected to a first end of the second line segment. A second end of the second line segment extends along the second direction or the opposite direction D2 of the second direction D2, to be connected to a first end of the third line segment. A second end of the third line segment extends to the lead area 501 from the display region 100 in a direction approaching the lead area, to be connected to an ith data line of the lead area 501.

In an exemplary implementation, at least one of the first line segment, the second line segment, and the third line segment may include a plurality of sub-segments. The plurality of sub-segments are interwoven to form grid patterns. The grid patterns each is a polygon enclosed by a plurality of sub-segments. In an exemplary implementation, a shape of the grid pattern may include any one or more of a triangle, a square, a rectangle, a rhombus, a trapezoid, a pentagon, and a hexagon.

In an exemplary implementation, the region enclosed by a plurality of sub-segments in one grid pattern includes an emitting region of a sub-pixel, and each sub-segment is located in a non-emitting region between adjacent emitting regions. For example, when the display substrate is an OLED display substrate, the emitting region is a region of a pixel opening in a pixel defining layer, and the non-emitting region is a region out of the pixel opening; an orthographic projection of the emitting region on the display substrate is within a range of an orthographic projection of a region enclosed by the sub-segments on the display substrate, and an orthographic projection of the sub-segment on the display substrate is within a range of an orthographic projection of the non-emitting region on the display substrate.

In an exemplary implementation, along a first direction D1, the display region 100 may be divided into four (N/2=4) sub-regions, that is, a first sub-region 600-1, a second sub-region 600-2, a third sub-region 600-3, and a fourth sub-region 600-4 that are arranged in sequence along an opposite direction of the first direction D1. In an exemplary implementation, lengths of the four sub-regions in the first direction D1 may be the same, or may be different, which is not limited in the present disclosure.

In an exemplary implementation, a second line segment of a first data fanout line 701 may include a plurality of sub-segments; and a first block-shaped grid pattern formed by the plurality of sub-segments may be arranged in a region where the first sub-region 600-1 is located. A second line segment of a second data fanout line 702 may include a plurality of sub-segments, and a second block-shaped grid pattern formed by the plurality of sub-segments may be arranged in a region where the second sub-region 600-2 is located. A second line segment of a third data fanout line 703 may include a plurality of sub-segments, and a third block-shaped grid pattern formed by the plurality of sub-segments may be arranged in a region where the third sub-region 600-3 is located. A second line segment of a fourth data fanout line 704 may include a plurality of sub-segments, and a fourth block-shaped grid pattern formed by the plurality of sub-segments may be arranged in a region where the fourth sub-region 600-4 is located.

In an exemplary implementation, the block-shaped grid pattern is formed by a plurality of grid patterns that are repeated and consecutively spliced in the first direction D1 and/or the second direction D2. The area occupied by at least one of the first block-shaped grid pattern, the second block-shaped grid pattern, the third block-shaped grid pattern and the fourth block-shaped grid pattern may be about 50-90% of the area of the sub-region where it is located.

In an exemplary implementation, at least one of a first line segment and a third line segment of the first data fanout line 701 may include a plurality of sub-segments. A first bar-shaped grid pattern formed by the plurality of sub-segments may be arranged in a region where the first sub-region 600-1 and the second sub-region 600-2 are located. The first bar-shaped grid pattern is connected to the first block-shaped grid pattern. At least one of a first line segment and a third line segment of the second data fanout line 702 may include a plurality of sub-segments. A second bar-shaped grid pattern formed by the plurality of sub-segments may be arranged in a region where the second sub-region 600-2 and the third sub-region 600-3 are located. The second bar-shaped grid pattern is connected to the second block-shaped grid pattern. At least one of a first line segment and a third line segment of the third data fanout line 703 may include a plurality of sub-segments. A third bar-shaped grid pattern formed by the plurality of sub-segments may be arranged in a region where the third sub-region 600-3 and the fourth sub-region 600-4 are located. The third bar-shaped grid pattern is connected to the third block-shaped grid pattern.

In an exemplary implementation, the bar-shaped grid pattern is formed by a plurality of grid patterns that are repeated and consecutively arranged in the first direction D1 or the second direction D2. In an exemplary implement ion mode, the bar-shaped grid pattern may include a plurality of bar-shaped grid sub-pattern, and the plurality of the bar-shaped grid sub-patterns are connected in sequence in the first direction D1 or the second direction D2.

In an exemplary implementation, a plurality of line segments of a kth data fanout line may form a grid wiring with the block-shaped grid patterns, the grid wiring formed by the kth data fanout line is within a grid wiring formed by a (k−1)th data fanout line, and thus a grid nested structure is formed, where k=2, 3, 4.

In the exemplary embodiment, the film layer structure of the data lines, the data fanout lines, and the lead wires may be similar to that in the foregoing exemplary embodiment, and will not be repeated here.

According to the exemplary embodiment of the present disclosure, the technical effects of the foregoing embodiments can be achieved, including effectively narrowing the lower border, effectively avoiding size deviation of two film layers, and effectively improving display uniformity and display quality. In addition, according to the present disclosure, the data fanout lines with the grid patterns are arranged, which may not only reduce resistance difference of the data fanout lines, but also reduce reflective optical difference of the data fanout lines. The lead wires in the first lead wire group are connected to the data lines through the data fanout lines, and the lead wires in the second lead group are directly connected to the data lines, so that the resistance of the lead wire in the first lead group is much greater than the resistance of the lead wire in the second lead group. This resistance difference will cause a problem on display, such as the color difference between the two sides and the middle, and flashing picture pinking. In the present disclosure, the data fanout lines with the grid patterns are provided, and the grid patterns substantially cover the entire display region, so that the resistance of the lead wires is effectively decreased, the resistance difference is effectively reduced, the display problem caused by the resistance difference is avoided, and display quality is improved. However, when the data fanout lines are arranged in a part of the display region, when viewed under sunlight or strong light, the reflective display difference will be caused by presence or absence of the data fanout lines, and accordingly, the problems on display will be caused. In the present disclosure, the data fanout lines with the grid patterns are provided, and the grid patterns substantially cover the entire display region, so that the reflective optical difference caused by the presence or absence of data fanout lines is effectively avoided, and display quality is improved.

Figure 20:
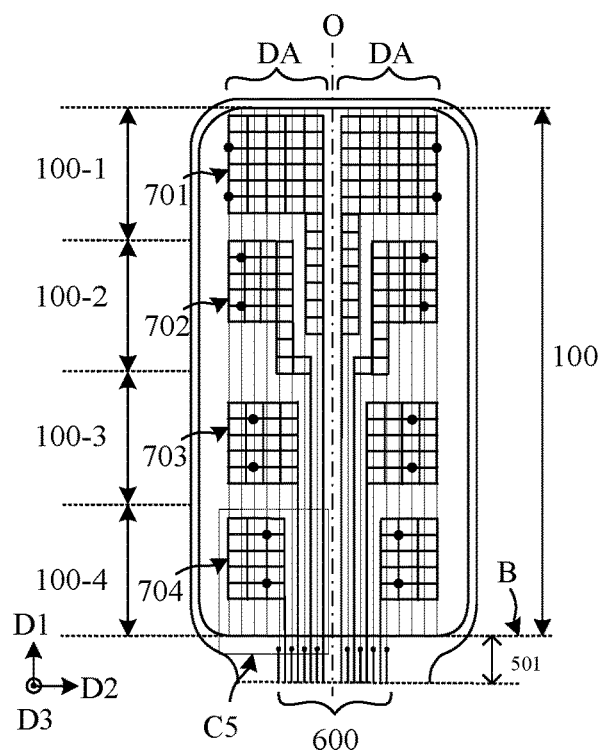
FIG. 20 is a schematic diagram of a structure of still another type of lead wires and data fanout lines according to an exemplary embodiment of the present disclosure.
Figure 21:
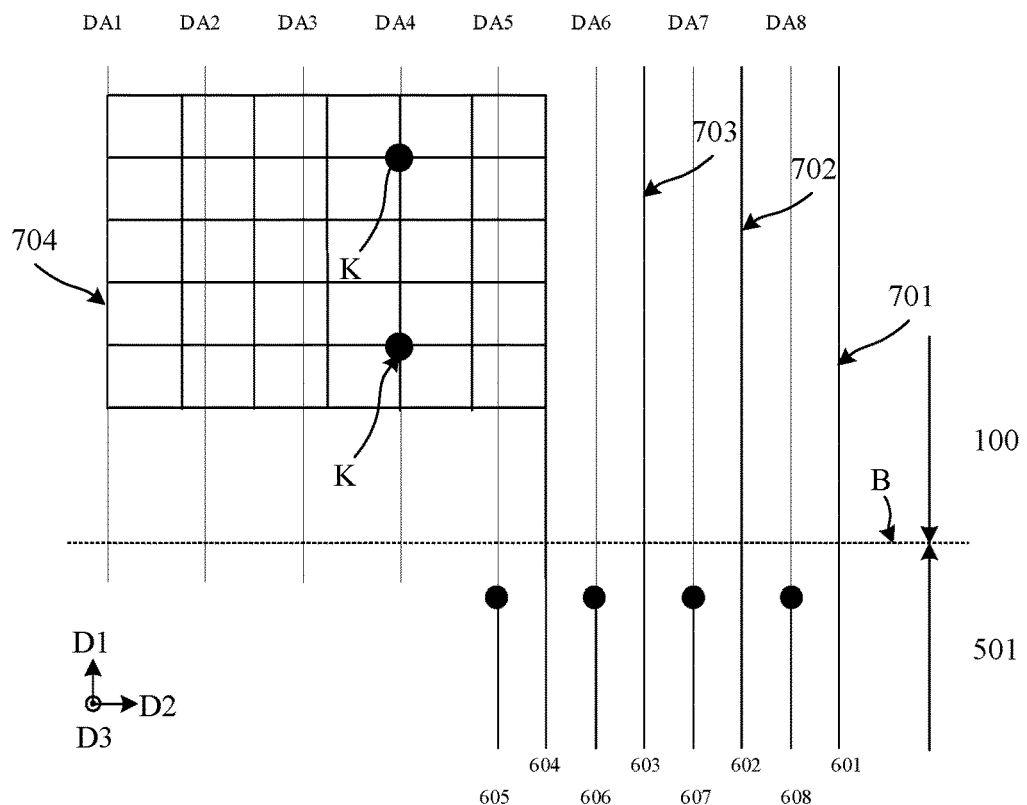
FIG. 21 is an enlarged view of region C5 in FIG. 20.

FIG. 20 is a schematic diagram of a structure of still another type of lead wires and data fanout lines according to an exemplary embodiment of the present disclosure. FIG. 21 is an enlarged view of region C5 in FIG. 20. As shown in FIG. 20 and FIG. 21, a plurality of data lines and a plurality of data fanout lines in a display region 100, and a plurality of lead wires in a lead area 501 may be symmetrically arranged relative to a center line O. That the left side of the display substrate contains eight (i.e., N=8) data lines, four data fanout lines, and eight lead wires is taken as an example for description below.

In an exemplary implementation, the arrangement of the eight data lines on the left side of the display region and the eight lead wires on the left side of the lead area 501 may be similar to that in the foregoing embodiment; the plurality of lead wires in the first lead group may be correspondingly connected to the plurality of data lines in the first data line group though a plurality of data fanout lines, and the plurality of lead wires in the second lead group may be directly correspondingly connected to the plurality of data lines in the second data line group.

In an exemplary implementation, the plurality of data fanout lines may be correspondingly connected to a plurality of data lines in the first data line group, in the display region 100.

In an exemplary implementation, an ith data fanout line may include a first line segment and a second line segment connected to each other. A first end of the first line segment is located near the edge B of the display region and connected to an ith lead wire. A second end of the first line segment extends in a direction away from the lead area, to be connected to a first end of the second line segment. A second end of the second line segment extends along the second direction D2 or the opposite direction of the second direction D2, to be connected to an ith data line.

In an exemplary implementation, at least one of the first line segment and the second line segment may include a plurality of sub-segments, and the plurality of sub-segments are interwoven to form a plurality of grid patterns. The structure of the grid patterns is similar to that in the foregoing embodiment.

In an exemplary implementation, a second line segment of a first data fanout line 701 may include a plurality of sub-segments; and a first block-shaped grid pattern formed by the plurality of sub-segments may be arranged in a region where the first sub-region 600-1 is located. A second line segment of a second data fanout line 702 may include a plurality of sub-segments, and a second block-shaped grid pattern formed by the plurality of sub-segments may be arranged in a region where the second sub-region 600-2 is located. A second line segment of a third data fanout line 703 may include a plurality of sub-segments, and a third block-shaped grid pattern formed by the plurality of sub-segments may be arranged in a region where the third sub-region 600-3 is located. A second line segment of a fourth data fanout line 704 may include a plurality of sub-segments, and a fourth block-shaped grid pattern formed by the plurality of sub-segments may be arranged in a region where the fourth sub-region 600-4 is located. In an exemplary implementation, the first line segment of the at least one data fanout line may include a plurality of subsegments, and the plurality of sub-segments form a bar-shaped grid pattern.

In an exemplary implementation, in an overlap region of an ith block-shaped grid pattern and the ith data line, the sub-segments in the i-th block-shaped grid pattern are connected to the ith data line through at least one via K. In an exemplary implementation, the sub-segments in the ith block-shaped grid pattern may be connected to the ith data line through a plurality of vias so as to improve connection reliability.

In the exemplary embodiment, the film layer structure of the data lines, the data fanout lines, and the lead wires may be similar to that in the foregoing exemplary embodiment, and will not be repeated here.

According to the exemplary embodiment of the present disclosure, the technical effects of the foregoing embodiments can be achieved, including effectively narrowing the lower border, effectively avoiding size deviation of two film layers, effectively improving display uniformity and display quality, reducing resistance difference, and reducing reflective optical difference of the data fanout lines. In addition, in the present disclosure, the display region is provided with a plurality of vias, and the data fanout lines are connected to the data lines through the plurality of vias, so that connection reliability is improved. When the lead area is provided with a via, there may be problems such as failure of a via connection due to factors such as corrosion or static electricity, which may cause display problems. In the present disclosure, the data fanout lines with the grid patterns are provided, and the grid patterns are connected to the data lines through the plurality of vias in the display region, so that the stability and reliability of the via connection is enhanced and display quality is improved.

Figure 22:
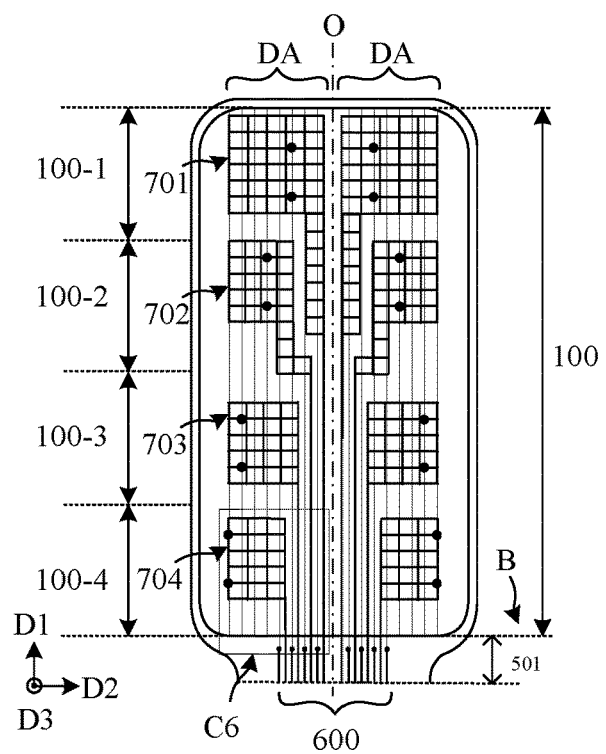
FIG. 22 is a schematic diagram of a structure of still another type of lead wires and data fanout lines according to an exemplary embodiment of the present disclosure.
Figure 23:
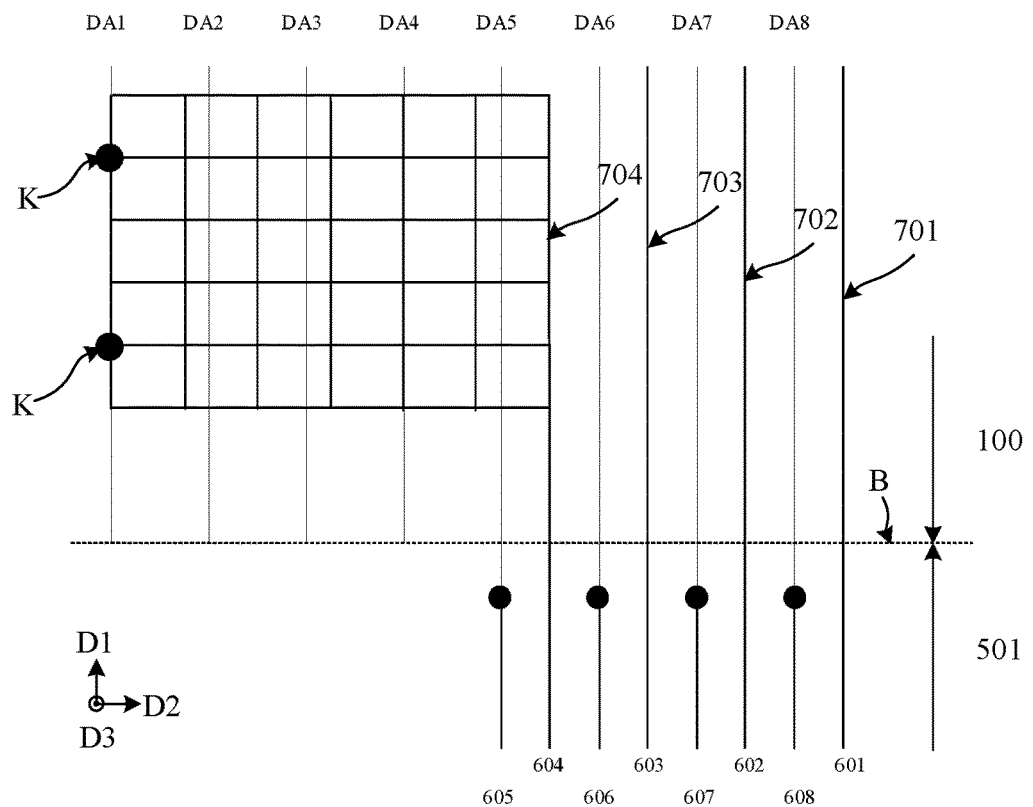
FIG. 23 is an enlarged view of region C6 in FIG. 22.

FIG. 22 is a schematic diagram of a structure of still another type of lead wires and data fanout lines according to an exemplary embodiment of the present disclosure. FIG. 23 is an enlarged view of region C6 in FIG. 22. As shown in FIG. 22 and FIG. 23, the structure of the data fanout lines in this exemplary embodiment is substantially similar to the structure of the data fanout lines in the embodiment shown in FIG. 21 and FIG. 20. The difference lies in that the fourth block-shaped grid pattern in the fourth data fanout line 704 is connected to the first data line DA1 through a plurality of vias, the third block-shaped grid pattern in the third data fanout line 703 is connected to the second data line DA2 through a plurality of vias, the second block-shaped grid pattern in the second data fanout line 702 is connected to the third data line DA3 through a plurality of vias, and the first block grid pattern in the first data fanout line 701 is connected to the fourth data line DA4 through a plurality of vias.

According to the exemplary embodiment of the present disclosure, the technical effects of the foregoing embodiments can be achieved, including effectively narrowing the lower border, effectively avoiding size deviation of two film layers, effectively improving display uniformity and display quality, reducing resistance difference, reducing reflective optical difference of the data fanout lines, enhancing stability and reliability of the via connection, and further improving display quality.

Figure 24:
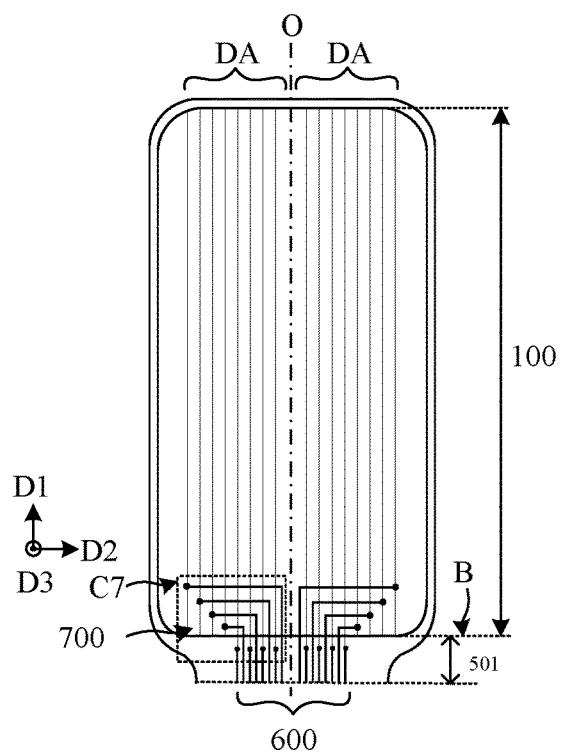
FIG. 24 is a schematic diagram of a structure of still another type of lead wires and data fanout lines according to an exemplary embodiment of the present disclosure.
Figure 25:
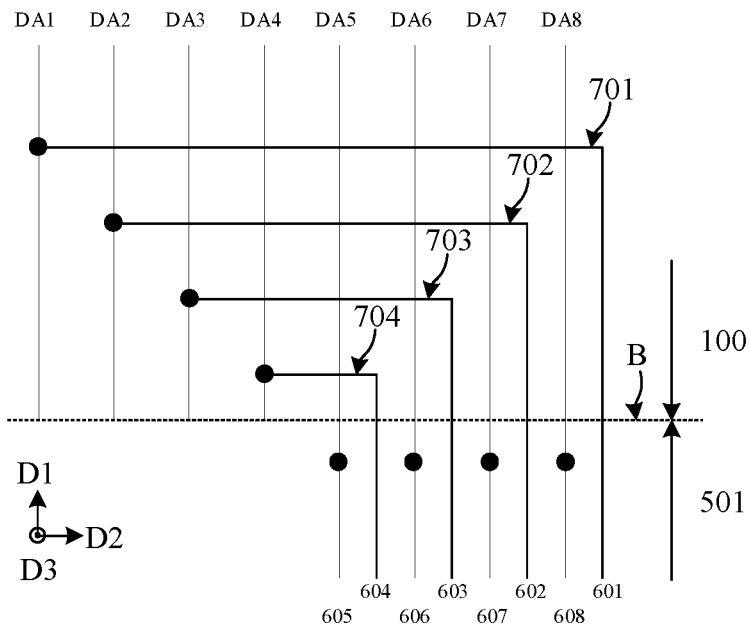
FIG. 25 is an enlarged view of region C7 in FIG. 24.

FIG. 24 is a schematic structural diagram of still another type of lead wires and data fanout lines according to an exemplary embodiment of the present disclosure. FIG. 25 is an enlarged view of region C7 in FIG. 24. As shown in FIG. 24 and FIG. 25, a plurality of data lines and a plurality of data fanout lines in a display region 100, and a plurality of lead wires in a lead area 501 may be symmetrically arranged relative to a center line O. That the left side of the display substrate contains eight (i.e., N=8) data lines, four data fanout lines, and eight lead wires is taken as an example for description below.

In an exemplary implementation, the arrangement of the eight data lines on the left side of the display region and the eight lead wires on the left side of the lead area may be similar to that in the foregoing embodiment; the plurality of lead wires in the first lead group may be correspondingly connected to the plurality of data lines in the first data line group through a plurality of data fanout lines, and the plurality of lead wires in the second lead group may be correspondingly connected to the plurality of data lines in the second data line group directly.

In an exemplary implementation, the plurality of data fanout lines may be correspondingly connected to a plurality of data lines in the first data line group in the display area.

In an exemplary implementation, an ith data fanout line may include a first line segment and a second line segment connected to each other. A first end of the first line segment is located near the edge B of the display region and connected to an ith lead wire. A second end of the first line segment extends in a direction away from the lead area, to be connected to a first end of the second line segment. A second end of the second line segment extends along a direction D2 or an opposite direction of the second direction D2, to be connected to an ith data line through a via.

In an exemplary implementation, a plurality of vias through which the data fanout lines are connected to the data lines have different distances from an edge B of the display region, that is, the plurality of vias are not located in the same pixel row.

In the exemplary embodiment, the film layer structure of the data lines, the data fanout lines, and the lead wires may be similar to that in the foregoing exemplary embodiment, and will not be repeated here.

According to the exemplary embodiment of the present disclosure, the technical effects of the foregoing embodiments can be achieved, including effectively narrowing the lower border, effectively avoiding size deviation of two film layers, and effectively improving display uniformity and display quality. In addition, in the present disclosure, the display region is provided with the vias, and the data fanout lines are connected to the data lines through the vias in the display region, thereby reducing the length of the data fanout lines, and being conductive to reduction of the space occupied by the data fanout lines, and lowering of the difficulty in wiring design.

Figure 26:
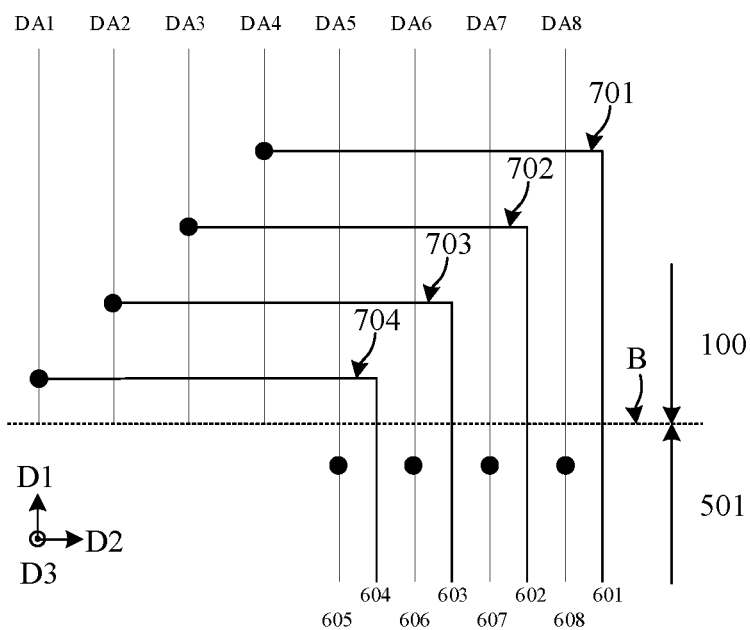
FIG. 26 is a schematic diagram of a structure of still another type of lead wires and data fanout lines according to an exemplary embodiment of the present disclosure.

FIG. 26 is a schematic diagram of a structure of still another type of lead wires and data fanout lines according to an exemplary embodiment of the present disclosure, and is an enlarged view of region C7 in FIG. 24. As shown in FIG. 26, the structure of the lead wires and the data fanout lines in this exemplary embodiment is similar to the structure in the embodiment shown in FIG. 25. The difference lies in that, the fourth data fanout line 704 is connected to the first data line DA1 through a via, the third data fanout line 703 is connected to the second data line DA2 through a via, the second data fanout line 702 is connected to the third data line DA3 through a via, and the first data fanout line 701 is connected to the fourth data line DA4 through a via.

In an exemplary implementation, a plurality of vias through which the data fanout lines are connected to the data lines have different distances from an edge B of the display region, that is, the plurality of vias are not located in the same pixel row.

In an exemplary implementation, extension lengths of the plurality of data fanout lines are substantially the same.

According to the exemplary embodiment of the present disclosure, the technical effects of the foregoing embodiments can be achieved, including effectively narrowing the lower border, effectively avoiding size deviation of two film layers, effectively improving display uniformity and display quality, shortening the data fanout lines, and being conductive to lowering the difficulty in wiring design. In addition, in the present disclosure, the extension lengths of the data fanout lines are substantially similar such that resistances of the plurality of data fanout lines are substantially similar, and the resistance drop difference of the plurality of data fanout lines is small, thereby realizing more uniform screen displaying and improving display quality.

An exemplary embodiment of the disclosure also provides a preparation method for a display substrate. In an exemplary implementation, the display substrate includes a display region and a bonding region on one side of the display region, the bonding region at least including a lead area; the preparation method may include the following operations.

A plurality of data lines and a plurality of data fanout lines are formed in the display region, and a plurality of lead wires are formed in the lead area, herein orthographic projections of the plurality of data lines and the plurality of data fanout lines on a plane of the display substrate are at least partially overlapped; at least one lead wire is connected to the data line through the data fanout line, and in the lead area, an orthographic projection of any one of the lead wires on the plane of the display substrate and orthographic projections of other lead wires on the plane of the display substrate have no overlap region.

An exemplary embodiment of the present disclosure also provides a display device, which includes the display substrate in the foregoing embodiments. The display device may be any product or component with a display function, such as a mobile phone, a tablet computer, a television, a display, a notebook computer, a digital photo frame, a navigator, an advertising panel, a smart watch, an E-book portable multimedia player, or a display screen of various products of Internet of Things. In an exemplary implementation, the display device may be a wearable display device, which can be worn on a human body in some manners, such as a smart watch, and a smart bracelet.

The accompanying drawings of the present disclosure only involve the structures involved in the present disclosure, and the other structures may refer to conventional designs. The embodiments in the present disclosure, i.e., the features in the embodiments, can be combined if there is no conflict, to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a display region and a bonding region on one side of the display region,
wherein the bonding region at least comprises a lead area; the display region comprises a plurality of data lines and a plurality of data fanout lines, the lead area comprises a plurality of lead wires, and orthographic projections of the plurality of data lines and the plurality of data fanout lines on a plane of the display substrate are at least partially overlapped; at least one lead wire is connected to a data line through a data fanout line; and in the lead area, an orthographic projection of any one of the lead wires on the plane of the display substrate and orthographic projections of other lead wires on the plane of the display substrate have no overlap region, and
wherein at least one data fanout line comprises a first line segment and a second line segment; a first end of the first line segment is connected to the lead wire, and a second end of the first line segment extends in a direction away from the lead area, to be connected to the second line segment; the second line segment comprises a plurality of sub-segments, the plurality of sub-segments are interwoven to form a plurality of grid patterns, the plurality of grid patterns are repeated and consecutively arranged in the first direction and/or the second direction, and at least one sub-segment is connected to the data line through a via; the second direction is intersected with the first direction, and the first direction is parallel to the data line.

2. The display substrate according to claim 1, wherein at least one lead wire is directly connected to the data line.

3. The display substrate according to claim 1, wherein a quantity of the data lines is greater than a quantity of the data fanout lines.

4. The display substrate according to claim 1, wherein the plurality of lead wires in the lead area have the same width, adjacent lead wires have the same spacing, the width and the spacing are dimensions in the second direction, the second direction is intersected with the first direction, and the first direction is parallel to the data line.

5. The display substrate according to claim 1, wherein in a direction parallel to the display substrate, the display substrate has a center line, the center line extends in a first direction and equally divides pixel columns of the display region, the first direction being parallel to the data lines; on a side of the center line, the plurality of data lines comprise a first data line group and a second data line group, and the plurality of lead wires comprise a first lead group and a second lead group; the first data line group comprises a first data line, a second data line, . . . , and an Mth data line that are arranged in sequence along a second direction, the second data line group is arranged on a side of the first data line group in the second direction, the second data line group comprises an (M+1)th data line, an (M+2)th data line, . . . , and an Nth data line that are arranged in sequence along the second direction, the second direction is intersected with the first direction; the first lead group comprises a first lead wire, a second lead wire, . . . , and an Mth lead wire that are arranged in sequence along an opposite direction of the second direction, the second lead group comprises an (M+1)th lead wire, an (M+2)th lead wire, . . . , and an Nth lead wire that are arranged in sequence along the second direction, the lead wires of the first lead group and the lead wires of the second lead group being alternately arranged; M, and N are positive integers greater than 2, and M is less than N; the lead wires in the first lead group are connected to the data lines in the first data line group through the data fanout lines, and the lead wires in the second lead group are directly connected to the data lines in the second data line group.

6. The display substrate according to claim 5, wherein in a direction perpendicular to the display panel, the display substrate comprises a first conductive layer, a second conductive layer, and a third conductive layer, and an insulating layer is arranged between the first conductive layer and the second conductive layer as well as between the second conductive layer and the third conductive layer; and the data lines and the data fanout lines are arranged in different conductive layers.

7. The display substrate according to claim 6, wherein the data fanout lines comprise odd data fanout lines and even data fanout lines, the odd data fanout lines are connected to the data lines in odd columns in the first data line group, and the even data fanout lines are connected to the data lines in even columns in the first data line group; and the odd data fanout lines and the even data fanout lines are arranged in different conductive layers.

8. The display substrate according to claim 7, wherein the lead wires comprise odd lead wires and even lead wires, the odd lead wires are connected to the data lines in the odd columns in the first data line group through the odd data fanout lines, or are directly connected to the data lines in odd columns in the second data line group; and the even lead wires are connected to the data lines in the even columns in the first data line group through the even data fanout lines, or are directly connected to the data lines in even columns in the second data line group; the odd lead wires and the odd data fanout lines are arranged in the same layer and are of an integrated structure connected to each other, and the even lead wires and the even data fanout lines are arranged in the same layer and are of an integrated structure connected to each other.

9. The display substrate according to claim 7, wherein the odd data fanout lines are arranged in the first conductive layer, the even data fanout lines are arranged in the second conductive layer, and the data lines are arranged in the third conductive layer; or, the even data fanout lines are arranged in the first conductive layer, the odd data fanout lines are arranged in the second conductive layer, and the data lines are arranged in the third conductive layer.

10. A display device, comprising the display substrate according to claim 1.

11. A preparation method for a display substrate, wherein the display substrate comprises a display region and a bonding region on a side of the display region, the bonding region at least comprising a lead area; the preparation method comprises:
forming a plurality of data lines and a plurality of data fanout lines in the display region, and forming a plurality of lead wires in the lead area, wherein orthographic projections of the plurality of data lines and the plurality of data fanout lines on a plane of the display substrate are at least partially overlapped; and at least one lead wire is connected to a data line through a data fanout line; wherein in the lead area, an orthographic projection of any one of the lead wires on the plane of the display substrate and orthographic projections of other lead wires on the plane of the display substrate have no overlap region,
wherein at least one data fanout line comprises a first line segment and a second line segment; a first end of the first line segment is connected to the lead wire, and a second end of the first line segment extends in a direction away from the lead area, to be connected to the second line segment; the second line segment comprises a plurality of sub-segments, the plurality of sub-segments are interwoven to form a plurality of grid patterns, the plurality of grid patterns are repeated and consecutively arranged in the first direction and/or the second direction, and at least one sub-segment is connected to the data line through a via; the second direction is intersected with the first direction, and the first direction is parallel to the data line.

* * * * *